United States Patent [19]
Mikoshiba et al.

[11] Patent Number: 6,022,814
[45] Date of Patent: Feb. 8, 2000

[54] MATERIAL OF FORMING SILICON OXIDE FILM, SILICON OXIDE FILM, METHOD OF FORMING SILICON OXIDE FILM AND SEMICONDUCTOR ELEMENT

[75] Inventors: Satoshi Mikoshiba, Yokohama; Yoshihiko Nakano, Tokyo; Shuji Hayase, Yokohama, all of Japan

[73] Assignee: Kabushiki Kaisha Toshiba, Kawasaki, Japan

[21] Appl. No.: 09/022,493

[22] Filed: Feb. 12, 1998

[30] Foreign Application Priority Data

Feb. 13, 1997 [JP] Japan .................................. 9-028943
Oct. 20, 1997 [JP] Japan .................................. 9-286533

[51] Int. Cl.$^7$ .................................................. H01L 21/44
[52] U.S. Cl. .......................... 438/789; 438/780; 438/781; 438/787; 438/790
[58] Field of Search .................... 438/778, 780, 438/781, 787, 789, 790

[56] References Cited

U.S. PATENT DOCUMENTS

| 5,324,690 | 6/1994 | Gelatos et al. | 437/236 |
| 5,858,869 | 1/1999 | Chen et al. | 438/597 |
| 5,858,871 | 1/1999 | Jeng | 438/623 |

OTHER PUBLICATIONS

Jeff W. Labadie, et al., Nanopore Foams of High Temperature Polymers, IEEE Transactions on Components, Hybrids and Manufacturing Technology, vol. 15, No. 6, (1992), pp. 925–930.

R.D. Miller, et al., Polyimide Nanofoams From Amorphous Phase Separated Triblosk Copolymers, A.C.S. Polymer Preprints, vol. 37, No. 1, (1996), pp. 148–149.

J.L. Hedrick, et al., Polyimide Nanofoams From Aliphatic Polyester Based Copolymers, A.C.S. Polymer Preprints, vol. 37, No. 1, (1996), pp. 156–157.

*Primary Examiner*—Charles Bowers
*Assistant Examiner*—L. A. Kilday
*Attorney, Agent, or Firm*—Oblon, Spivak, McClelland, Maier & Neustadt, P.C.

[57] ABSTRACT

A material of forming silicon oxide film comprising a polymer having a repeating unit represented by the following general formula (1A), (1B) or (1C);

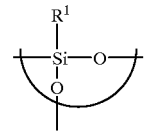

(1A)

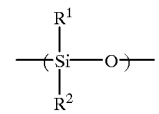

(1B)

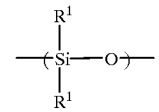

(1C)

wherein $R^1$ is a substituent group which can be eliminated at a temperature ranging from 250° C. to the glass transition point of the material of forming silicon oxide film; and $R^2$ is a substituent group which cannot be eliminated at a temperature of 250° C. or more.

4 Claims, 2 Drawing Sheets

MATERIAL OF FORMING SILICON OXIDE FILM, SILICON OXIDE FILM, METHOD OF FORMING SILICON OXIDE FILM AND SEMICONDUCTOR ELEMENT

BACKGROUND OF THE INVENTION

This invention relates to a material of forming silicon oxide film, a silicon oxide film, a method for forming these oxide films and a semiconductor element.

In order to ensure an insulation from other region, an insulating film is generally formed on the surface or wiring layer of a semiconductor element or of a liquid crystal display device. In the formation of an insulating film for covering a wiring layer, a method of depositing a silicon compound film by means of thermal oxidation or CVD method for instance is generally employed. However, an insulating film to be formed by means of CVD method is relatively high in dielectric constant, i.e. approximately 4.2. Therefore, there is a need for a development of an insulating film having lower dielectric constant which is suited for use in a semiconductor device of high capacity and high-speed.

A coating type silicone polymer has been developed for lowering the dielectric constant. However, this coating type silicone polymer is still high in dielectric constant, i.e. approximately 3.0, and is not high enough in heat resistance. On the other hand, it is now studied to lower the dielectric constant of an insulating film by increasing the free volume of the film by introducing an air bubble into the film. However, this method is accompanied with problems that it is difficult to control the volume of the air bubble and that if the air bubble is too large, water may be adsorbed in the air bubble, thus resulting in an increase in dielectric constant of the insulating film. Moreover, the water in the air bubble may be evaporated during a high temperature processing, thus giving rise to a problem of the disconnection of wiring.

As illustrated above, the conventional insulating film to be formed by means of CVD method is too high, i.e. approximately 4.2, in dielectric constant. Even with the coating type silicone polymer, it is difficult to obtain an insulating film exhibiting a sufficiently low dielectric constant. Moreover, the coating type silicone polymer is accompanied with a problem of heat resistance and hence is not suited for use as an insulating film for a semiconductor device.

BRIEF SUMMARY OF THE INVENTION

Therefore, an object of this invention is to provide a material of forming silicon oxide film, which enables to form a silicon oxide film having a low density and a large free volume.

Another object of this invention is to provide a silicon oxide film which is excellent in heat resistance and sufficiently low in dielectric constant, and to provide a method for forming such a silicon oxide film.

A still another object of this invention is to provide a semiconductor element provided with an insulating film consisting of such a silicon oxide film.

Namely, according to the present invention, there is provided a material of forming silicon oxide film comprising a polymer having at least one kind of repeating units represented by the following general formulas (1A), (1B) and (1C).

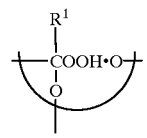

(1A)

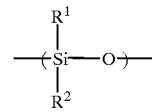

(1B)

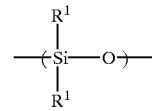

(1C)

wherein $R^1$ is a substituent group which can be eliminated at a temperature ranging from 250° C. to the glass transition point of the material of forming silicon oxide film; and $R^2$ is a substituent group which cannot be eliminated at a temperature of 250° C. or more.

Preferably, $R^2$ is a substituent group which cannot be eliminated at a temperature of the glass transition point of the material or less.

According to the present invention, there is further provided a material of forming silicon oxide film comprising a polymer having at least one kind of repeating units represented by the following general formulas (2A), (2B) and (2C).

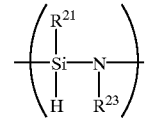

(2A)

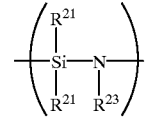

(2B)

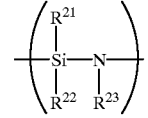

(2C)

wherein $R^{21}$ is a substituent group which can be eliminated at a temperature ranging from 250° C. to the glass transition point of the material of forming silicon oxide film; $R^{22}$ is a substituent group which cannot be eliminated at a temperature of 250° C. or more; and $R^{23}$ is hydrogen atom, a substituted or unsubstituted alkyl group, or a substituted or unsubstituted aromatic group.

Preferably, $R^{22}$ is a substituent group which cannot be eliminated at a temperature of the glass transition point of the materiel or less.

According to the present invention, there is further provided a method for forming a silicon oxide film, which comprises the steps of;

forming a resin layer by coating the afore-mentioned material of forming silicon oxide film on a substrate, and by heat-treating the material of forming silicon oxide film coated on the substrate; and heating the resin layer at a temperature ranging from 250° C. to the glass transition point of the material of forming silicon oxide film.

According to the present invention, there is further provided a silicon oxide film having an Si—O network as a back bone, containing fine pores therein, and having a density of 0.8 to 1.4 g/cm$^3$, an average pore diameter of the fine pores being 1 to 3 nm and a surface area of the fine pores being 600 to 1,500 m$^2$/g.

According to the present invention, there is further provided a semiconductor element provided with an insulating film consisting of a silicon oxide film having an Si—O network as a back bone, containing fine pores therein, and having a density of 0.8 to 1.4 g/cm$^3$, an average pore diameter of the fine pores being 1 to 3 nm and a surface area of the fine pores being 600 to 1,500 m$^2$/g.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
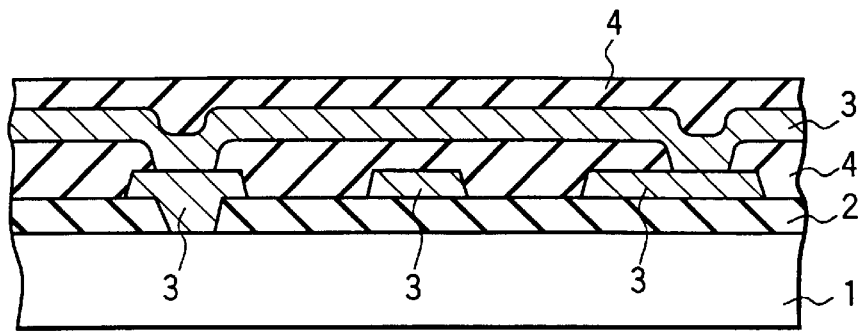
FIG. 1 is a cross-sectional view of one example of LSI provided with an interlayer insulating film consisting of a silicon oxide film which has been formed according to the method of this invention.

Followings are detailed explanation of this invention.

According to a first material of forming silicon oxide film of this invention, the substituent group R$^1$ to be introduced into the repeating units represented by the aforementioned general formulas (1A), (1B) and (1C) can be optionally selected from any kinds of substituent group as long as it can be eliminated at a temperature ranging from 250° C. to the glass transition point of the aforementioned material of forming silicon oxide film. For example, a substituted or unsubstituted alkyl or alkoxy group may be employed as the substituent group R$^1$. Specific examples of the substituent group R$^1$ are 3,3,3-trifluoropropyl group, β-phenethyl group, t-butyl group, 2-cyanoethyl group, benzyl group and vinyl group. These substituent groups may be in the form of derivatives thereof. Among these substituent groups, a substituent group having an electron withdrawing group at β-position (such as 3,3,3-trifluoropropyl group) and t-butyl group are more preferable, since when they are heated causing β-elimination, the compound is mainly consisted of an Si—H bond, thus exhibiting water repellency. In particular, the employment of 3,3-trifluoropropyl group is more preferable, since it is partially isomerized at the moment of β-elimination thereby to form an Si—F bond, thus improving the water repellency and lowering dielectric constant.

The aforementioned repeating units are included as a polymer having a predetermined molecular weight in the first material of forming silicon oxide film of this invention. In this case, a preferable molecular weight of the polymer is in the range of 500 to 1,000,000. Because, if the molecular weight is less than 500, it may be difficult to obtain a film of desired quality when the material of forming silicon oxide film is formed into a film. On the other hand, if the molecular weight exceeds over 1,000,000, the coating property of the material of forming silicon oxide film may be deteriorated.

Any of the repeating units represented by the aforementioned general formulas (1A), (1B) and (1C) can be included in the first material of forming silicon oxide film as a homopolymer consisting only of these repeating units, or as a copolymer containing other kinds of repeating unit. The examples of such a copolymer include a compound represented by the following general formula (4).

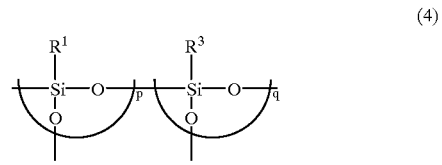

(4)

wherein R$^1$ is a substituent group which can be eliminated at a temperature ranging from 250° C. to the glass transition point of said material of forming silicon oxide film; R$^3$ is a substituent group which cannot be eliminated at a temperature ranging from 250° C. to the glass transition point of the material, or a siloxane bond; and p and q are integers.

The synthesis of these polymers constituting a component of the first material of forming silicon oxide film can be performed as follows. Namely, the compound represented by the following general formula (5) can be polymerized through hydrolysis, etc., together with other kind of compound if desired, in water; in an organic solvent such as alcohols (ethanol, isopropyl alcohol, butanol, etc.), ethyl-Cellosolve, toluene and methylisobutyl ketone; in a mixed solvent of these organic solvents; or in any other kinds of solvent. For example, the compound represented by the following general formula (5) is dissolved, together with other kinds of compound if desired, in a solvent and then allowed to react at a temperature of 50 to 120° C. for 0.5 to 24 hours, thereby obtaining a polymer constituting a component of the first material of forming silicon oxide film of this invention.

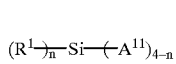
(5)

wherein $R^1$ is a substituent group which can be eliminated at a temperature ranging from 250° C. to the glass transition point of said material of forming silicon oxide film; $A^{11}$ is halogen atom, hydroxyl group or alkoxy group; and n is an integer of 1 to 3.

Another example of compounds that can be copolymerized with the aforementioned repeating units is the compound represented by the following general formula (6).

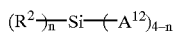
(6)

wherein $R^2$ is a substituent group which cannot be eliminated at a temperature ranging from 250° C. to the glass transition point of the material, such as methyl, phenyl and hydrogen atom; $A^{12}$ is halogen atom, hydroxyl group or alkoxy group; and n is an integer of 1 to 3.

The aforementioned polymerization may be performed in the presence of a catalyst such as an acid catalyst (such as hydrochloric acid, nitric acid, sulfuric acid, etc.) or a basic catalyst so as to promote the polymerization reaction.

Further, for the purpose of controlling the molecular weight of the polymer to be produced as well as for the purpose of improving the storage stability of the polymer to be produced, the terminal of the polymer may be treated by making use of the compound represented by the following general formula (7).

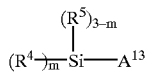
(7)

wherein $R^4$ and $R^5$ may be the same or different and are individually a substituted or unsubstituted alkyl group; $A^{13}$ is halogen atom, hydroxyl group or alkoxy group; and m is an integer of 1 or 2.

After the polymerization, the resultant polymer may be subjected to a refining process thereby to perform the substitution of solvent, to remove water or catalyst, or to control the molecular weight thereof through a re-precipitation.

The compound represented by the aforementioned general formula (5) may be employed by selecting only one kind thereof or by combining two or more kinds thereof. Likewise, the compound represented by the aforementioned general formula (6) may be employed by combining two or more kinds thereof.

When a polymer comprising a repeating unit represented by the aforementioned general formula (1A), (1B) or (1C) is to be employed as a homopolymer, a polymer comprising a repeating unit represented by the following general formula (1D) may be incorporated therein, and the resultant resin composition may be employed for preparing the first material of forming silicon oxide film.

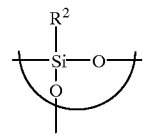
(1D)

wherein $R^2$ is a substituent group which cannot be eliminated at a temperature ranging from 250° C. to a glass transition point of said material of forming silicon oxide film.

This polymer having such a repeating unit may be a homopolymer consisting only of the repeating unit represented by the aforementioned general formula (1D) or a copolymer containing another kind of repeating unit. For example, a polymer having the repeating unit represented by the aforementioned general formula (1D) can be obtained by polymerizing the compound represented by the aforementioned general formula (6) together with, if desired, another kind of compound in a predetermined solvent.

As for the solvent employable in this case, water, alcohols and organic solvents are suited for use. As in the case of the polymer comprising a repeating unit represented by the aforementioned general formula (1A), (1B) or (1C), a catalyst such as an acid catalyst and a basic catalyst may be employed. Additionally, the terminal of the polymer may be treated by making use of the compound represented by the aforementioned general formula (7). A preferable molecular weight of this polymer is in the range of 500 to 1,000,000 for the same reason as explained above.

As a polymer having a repeating unit represented by the aforementioned general formula (1D), a silicone resin available on the market, such as hydrogensilsesquioxane (Dow Corning Co., Ltd.) or OCD type 11 (Tokyo Ohka Kogyo Co., Ltd.) may be employed.

The repeating unit represented by the general formula (1D) may be incorporated as a copolymer component into a polymer comprising a repeating unit represented by the aforementioned general formula (1A), (1B) or (1C).

A homopolymer or copolymer comprising a repeating unit represented by the aforementioned general formula (1A), (1B) or (1C) may contain at least one kind of repeating units represented by the following general formulas (3A), (3B), (3C) and (3D).

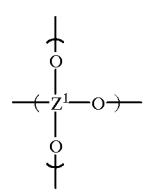
(3A)

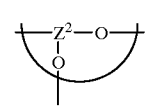
(3B)

(3C)

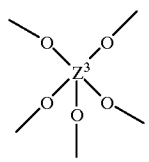

(3D)

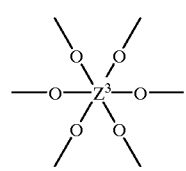

wherein $Z^1$ is Ti or Zr; $Z^2$ is Al; and $Z^3$ is W.

When a linkage of atoms such as —Ti—O—, —Al—O—, —Zr—O— or —W—O— is incorporated into a polymer comprising a repeating unit represented by the aforementioned general formula (1A), (1B) or (1C), the elimination temperature of $R^1$ which is directly linked to a silicon atom would be lowered, thus accelerating the elimination rate of $R^1$. Namely, the thermal elimination reaction of the substituent group $R^1$ can be promoted. In particular, when —Ti—O— linkage is introduced into the polymer, the temperature condition in the process of forming an insulation film can be freely controlled. Moreover, a material of forming silicon oxide film comprising any of these linkages is fast in reaction rate of dehydration condensation and hence the rate of forming the main skeleton is promoted, thus expanding the degree of freedom on the processing conditions.

The copolymer comprising any of these linkages can be synthesized by making use of a compound represented by the aforementioned general formula (5) and any one of the compounds represented by the following general formulas (8) to (11) as a raw material (if required, the raw material may further contain a compound represented by the aforementioned general formula (6)). Specifically, these compounds are dissolved in a solvent at first, and then allowed to react at a temperature ranging from room temperature to 120° C. for a time period ranging from 0.1 to 24 hours to obtain an aimed copolymer.

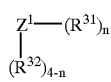
(8)

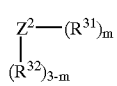
(9)

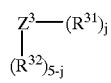
(10)

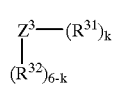
(11)

wherein $Z^1$ is Ti or Zr; $Z^2$ is Al; and $Z^3$ is W; $R^{31}$ and $R^{32}$ may be the same or different and are individually alkoxy group or halogen atom; n is an integer of 1 to 3; m is an integer of 1 or 2; j is an integer of 1 to 4; and k is an integer of 1 to 5.

Specific examples of the compound represented by the general formula (8) are titanium isopropoxide, titanium isobutoxide, titanium isoethoxide, titanium isopropoxide bis(ethylacetate), titanium diisopropoxide (tetramethylheptane dionate), titanium diisopropoxide bis(2,4-pentane dionate), titanium di-n-butoxide bis(2,4-pentane dionate), zirconium-n-butoxide, zirconium-t-butoxide, zirconium di-n-butoxide bis(2,4-pentane dionate), zirconium ethoxide, zirconium hexafluoropentane dionate, zirconium isopropoxide, zirconium-2,4-pentane dionate, zirconium-n-propoxide, zirconium-2,2,6,6-tetramethyl-3,5-heptane dionate, and zirconium trifluoropentane dionate.

Specific examples of the compound represented by the general formula (9) are aluminum ethoxide, aluminum isopropoxide, aluminum-2,4-pentane dionate, aluminum hexafluoropentane dionate, aluminum trifluoropentane dionate, and aluminum ethylacetate. Specific examples of the compounds represented by the general formulas (10) and (11) are tungsten (V) ethoxide, tungsten (VI) ethoxide, and tungsten (VI) phenoxide.

The effect of the repeating unit represented by the general formulas (3A), (3B), (3C) and (3D) can be obtained by introducing them at a ratio of about 0.1% into the copolymer. If the ratio of the repeating unit represented by the general formulas (3A) to (3D) is excessive, the dielectric constant of the oxide film to be obtained may be increased. Therefore, the upper limit of the ratio of the repeating unit represented by the general formulas (3A) to (3D) in the copolymer should preferably be about 50%.

When the first material of forming silicon oxide film of this invention is to be prepared as a composition comprising two or more kinds of polymers, the repeating unit such as represented by the aforementioned general formulas (3A) to (3D) may be included in the composition either as a copolymer component or as an additive or a separate polymer.

A polymer comprising a repeating unit represented by the aforementioned general formula (1A), (1B) or (1C) may be mixed, if desired, with a polymer comprising a repeating unit represented by the aforementioned general formula (1D), and then dissolved in a solvent such as isopropyl alcohol or methylisobutyl ketone to prepare a polymer solution. In this case, the polymer solution may contain another kind of silicone polymer represented by any of the following general formulas (12), (13) and (14). It is advantageous in view of the quality of obtained film and film-forming property.

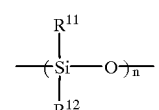
(12)

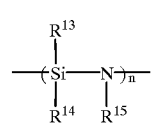
(13)

-continued

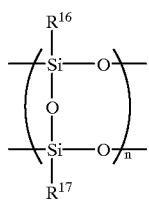
(14)

wherein $R^{11}$ and $R^{12}$ may be the same or different and are individually alkyl group; $R^{13}$, $R^{14}$ and $R^{15}$ may be the same or different and are individually alkyl group or hydrogen atom; and $R^{16}$ and $R^{17}$ may be the same or different and are individually alkyl group or hydrogen atom.

Next, a second material of forming silicon oxide film according to this invention will be explained.

The second material of forming silicon oxide film according to this invention comprises a polymer having at least one kind of repeating units represented by the following general formulas (2A), (2B) and (2C).

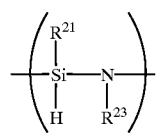
(2A)

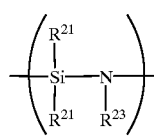
(2B)

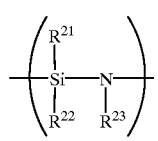
(2C)

wherein $R^{21}$ is a substituent group which can be eliminated at a temperature ranging from 250° C. to the glass transition point of said material of forming silicon oxide film; $R^{22}$ is a substituent group which cannot be eliminated at a temperature of 250° C. or more; and $R^{23}$ is hydrogen atom, a substituted or unsubstituted alkyl group, or a substituted or unsubstituted aromatic group.

As for the substituent group $R^{21}$ which can be eliminated at a temperature ranging from 250° C. to the glass transition point of the aforementioned material of forming silicon oxide film, the same kinds of substituent group that have been explained with reference to $R^1$ in the general formulas (1A), (1B) and (1C) can be employed. In this case also, the employment of 3,3,3-trifluoropropyl group is most preferable for the same reason as explained above.

The repeating units represented by the afore-mentioned general formulas (2A), (2B) and (2C) are included as a polymer having a predetermined molecular weight in the second material of forming silicon oxide film of this invention. In this case, a preferable molecular weight of the polymer is in the range of 500 to 1,000,000 for the same reasons as explained above.

Any of the repeating units represented by the aforementioned general formulas (2A), (2B) and (2C) can be included in the second material of forming silicon oxide film as a homopolymer consisting only of these repeating units, or as a copolymer containing other kinds of repeating unit. The examples of such a copolymer include a compound represented by the following general formula (15).

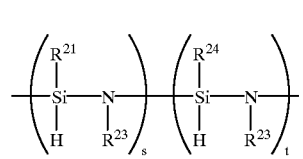
(15)

wherein $R^{21}$ is a substituent group which can be eliminated at a temperature ranging from 250° C. to the glass transition point of said material of forming silicon oxide film; $R^{23}$ is hydrogen atom, a substituted or unsubstituted alkyl group, or a substituted or unsubstituted aromatic group; $R^{24}$ is a substituent group which cannot be eliminated at a temperature ranging from 250° C. to the glass transition point of the material or hydrogen atom; and s and t are integers.

The synthesis of these polymers constituting a component of the second material of forming silicon oxide film can be performed as follows. Namely, the compound represented by the following general formula (16A), (16B) or (16C) can be polymerized, together with other kind of compound if desired, through hydrolysis, etc. by way of a reaction with dry ammonia or amine, in an organic solvent such as methylene chloride, chloroform, carbon tetrachloride, diethyl ether, tetrahydrofuran, pentane, hexane, heptane, cyclohexane, benzene, toluene, xylene and pyridine; or in a mixed solvent of these organic solvents.

Although there is not any particular limitation regarding the reaction temperature as long as the reaction mixture can be kept liquid, a reaction temperature ranging from −78° C. to 200° C. may be preferable, i.e. the reaction would sufficiently proceed even at room temperature. Ammonia and amine may be employed as a gas or as a liquid. There is not any particular limitation regarding the pressure at the moment of reaction, i.e. the reaction would sufficiently proceed even under the atmospheric pressure. Since this reaction proceeds in high speed, there is not any restriction regarding the reaction time.

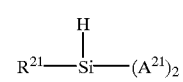
(16A)

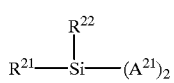
(16B)

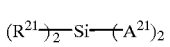
(16C)

wherein $R^{21}$ is a substituent group which can be eliminated at a temperature ranging from 250° C. to the glass transition point of said material of forming silicon oxide film; $R^{22}$ is a substituent group which cannot be eliminated at a temperature ranging from 250° C. to the glass transition temperature of the material; and $A^{21}$ is halogen atom.

The compounds that can be copolymerized with the aforementioned repeating units are the compound represented by the following general formulas (17A) and (17B).

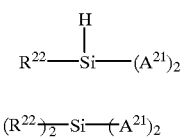

(17A)

(17B)

wherein $R^{21}$ is a substituent group which can be eliminated at a temperature ranging from 250° C. to the glass transition point of said material of forming silicon oxide film; $R^{22}$ is a substituent group which cannot be eliminated at a temperature ranging from 250° C. to the glass transition point of the material; and $A^{21}$ is halogen atom.

The compounds represented by the aforementioned general formulas (16A), (16B) and (16C) may be employed by selecting only one kind thereof or by combining two or more kinds thereof. Likewise, the compounds represented by the aforementioned general formulas (17A) and (17B) may be employed by combining two or more kinds thereof.

When a polymer comprising a repeating unit represented by the aforementioned general formula (2A), (2B) or (2C) is to be employed as a homopolymer, a polymer comprising a repeating unit represented by the following general formula (2D) or (2E) may be incorporated therein, and the resultant resin composition may be employed for preparing the second material of forming silicon oxide film.

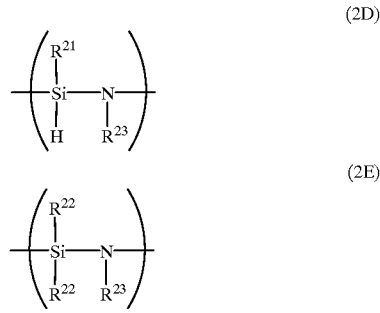

(2D)

(2E)

wherein $R^{22}$ is a substituent group which cannot be eliminated at a temperature ranging from 250° C. to the glass transition point of the material; and $R^{23}$ is hydrogen atom, a substituted or unsubstituted alkyl group, or a substituted or unsubstituted aromatic group.

This polymer having such a repeating unit may be a homopolymer consisting only of the repeating unit represented by the aforementioned general formula (2D) or (2E), or a copolymer containing another kind of repeating unit. For example, a polymer having the repeating unit represented by the aforementioned general formula (17A) or (17B) can be copolymerized with, if desired, another kind of compound in a predetermined solvent.

As for the solvent employable in this case, organic solvents are suited for use. As in the case of the polymer comprising a repeating unit represented by the aforementioned general formula (2A), (2B) or (2C), a catalyst such as an acid catalyst and a basic catalyst may be employed. A preferable molecular weight of this polymer is in the range of 500 to 1,000,000 for the same reason as explained above.

As a polymer having a repeating unit represented by the aforementioned general formula (2D) or (2E), a silicone resin available on the market, such as hydrogensilsesquioxane (Dow Corning Co., Ltd.), OCD type 11 (Tokyo Ohka Kogyo Co., Ltd.) or polyhydrosilazane (Tonen Corporation) may be employed.

The repeating unit represented by the general formula (2D) or (2E) may be incorporated as a copolymer component into a polymer comprising a repeating unit represented by the aforementioned general formula (2A), (2B) or (2C).

A homopolymer or copolymer comprising a repeating unit represented by the aforementioned general formula (2A), (2B) or (2C) may contain at least one kind of repeating units represented by the general formulas (3A), (3B), (3C) and (3D), which are explained with reference to the first material of forming silicon oxide film.

When a linkage of atoms such as —Ti—O—, —Al—O—, —Zr—O— or —W—O— is incorporated into a polymer comprising a repeating unit represented by the aforementioned general formula (2A), (2B) or (2C), the reaction rate of dehydration condensation of the second oxide film would be accelerated, the rate of forming the main skeleton is promoted, and the elimination temperature of $R^{21}$ would be lowered, thus expanding the degree of freedom on the processing conditions.

The copolymer comprising any of these linkages can be synthesized by making use of a compound represented by the aforementioned general formula (16A), (16B) or (16C) and any one of the compounds represented by the aforementioned general formulas (8) to (11) as a raw material (if required, the raw material may further contain a compound represented by the aforementioned general formula (17A) or (17B)). Specifically, these compounds are dissolved in a solvent at first, and then allowed to react at a temperature ranging from room temperature to 120° C. for a time period ranging from 0.1 to 24 hours to obtain an aimed copolymer.

As for the specific examples of the compound represented by the general formulas (8) to (11), the same compounds can be employed. As for the content of the compound represented by the general formulas (8) to (11), it may be the same as in the case of the first material of forming silicon oxide film.

When the second material of forming silicon oxide film of this invention is to be prepared as a composition comprising two or more kinds of polymers, the repeating unit such as represented by the aforementioned general formulas (3A) to (3D) may be included in the composition either as a copolymer component or as an additive or a separate polymer.

A polymer comprising a repeating unit represented by the aforementioned general formula (2A), (2B) or (2C) may be mixed, if desired, with a polymer comprising a repeating unit represented by the aforementioned general formula (2D) or (2D), and then dissolved in an organic solvent to prepare a polymer solution. In this case, if a silicone polymer represented by any of the aforementioned general formulas (12), (13) and (14) is mixed in this polymer solution, the film-forming property as well as the quality of film can be improved.

For the purpose of promoting the oxidation or hydrolysis of polysilazane, a catalyst may be mixed in the material of forming silicon oxide film of the second invention. In this case, a metallic catalyst such as Zr, Ti and Al; an acid or an alkali may be employed as a catalyst. It is also possible to promote these reactions by making use of a water vapor.

The formation of a silicon oxide film by making use of the material of forming silicon oxide film of this invention can be performed as follows. Namely, a polymer solution prepared as mentioned above is coated on a predetermined substrate by means of a spin-coating method for instance, and then heat-treated at a temperature of 50 to 200° C. for 1 to 20 minutes thereby to form a resin layer. Then, the resin layer formed on the substrate is heated at a temperature ranging from 250° C. to the glass transition point of the material of forming silicon oxide film for 0.5 to 24 hours thereby to form a silicon oxide film of low dielectric constant. The heating in this case may be performed by gradually raising the temperature up to about 700° C. For example, the baking of the film at a temperature of 250° C. for one hour, at a temperature of 350° C. for one hour, and then at a temperature of 450° C. for three hours may be preferable in view of alleviating the strain of the oxide film as well as in view of accelerating the thermal elimination of the substituent group.

It is possible, by making use of the material of forming silicon oxide film of this invention and by heat-treating the film in accordance with the aforementioned process, to obtain a silicon oxide film having an Si—O network as a back bone, containing fine pores therein, and having the following properties. Namely, it is possible to obtain a silicon oxide film having a density of 0.8 to 1.4 g/cm$^3$, an average pore diameter of 1 to 3 nm and a surface area of 600 to 1,500 m$^2$/g. Since the silicon oxide film of this invention is low in density, the free volume thereof is large. Furthermore, the low density of silicon oxide film is attained not through the fine pore of the oxide film but through the very fine pore (i.e. as small as 3 nm in average radius) of the oxide film. Therefore, it is possible to decrease the dielectric constant to a level which is suited for use as an insulating film for a semiconductor element.

More preferably, the density of the silicon oxide film of this invention should be 0.8 to 1.3 g/cm$^3$, an average pore diameter thereof should be 1 to 2 nm.

If this silicon oxide film is formed in accordance with the aforementioned procedures as an insulating film between wiring layers or electrodes in a silicon wafer provided with a mono- or multi-wiring layers or in a semiconductor substrate provided with a pnp type transistor, a semiconductor element which is excellent in reliability and of high-speed can be obtained. This invention is applicable not only to the aforementioned substrates, but also to any kinds of substrate which need the provision of an insulating film.

The polymer having a specific repeating unit constituting a component of the material of forming silicon oxide film of this invention exhibits an increase in molecular weight due to a crosslinking reaction as it is exposed to a temperature ranging from room temperature to 250° C. The substituent groups that take part in the crosslinking reaction are Si—OR, Si—OH and Si—H, thus forming an Si—O—Si bond at a temperature of less than 250° C. Then, when the film is heat-treated at a temperature ranging from 250° C. to the glass transition point of the material of forming silicon oxide film, the substituent $R^1$ l in the aforementioned general formula (1) is eliminated in the case of the first material of forming silicon oxide film, thus forming pores therein. On the other hand, in the case of the second material of forming silicon oxide film, the substituent $R^{21}$ in the aforementioned general formula (2) is eliminated, thus forming pores therein. Since an Si—O—Si linkage is formed in advance through the crosslinking reaction of the film, the volume of the film would be hardly changed even if the substituent $R^1$ or $R^{21}$ is eliminated as the elimination of these substituent groups is effected at a temperature not less than the network forming temperature and not higher than the glass transition temperature. Accordingly, it is possible to form desired pores between molecules, thus increasing the free volume of the oxide film.

Since an Si—N bond is included in a polymer to be contained in the material of forming silicon oxide film according to the second material of forming silicon oxide film of this invention, the temperature condition in the process of forming an insulating film can be freely controlled. The reason is that since the Si—N bond is highly reactive, the formation of the main skeleton can be realized at relatively low temperatures.

Namely, in the case of the silicon oxide film to be formed by making use of the material of forming silicon oxide film of this invention, it is possible to provide the oxide film with any desired free volume therein by allowing a predetermined substituent group to be eliminated through a heat-treatment thereof at a temperature ranging from 250° C. to the glass transition point of the material of forming silicon oxide film. The dielectric constant of silicon dioxide is about 4.2, whereas the dielectric constant of air is approximately 1, so that the dielectric constant of an oxide film is lowered as the free volume thereof is increased. Therefore, if a material of forming silicon oxide film containing a large proportion of a substituent group which can be eliminated at a temperature ranging from 250° C. to the glass transition point of the material of forming silicon oxide film is employed, a silicon oxide film of lower dielectric constant can be formed.

There is not any particular limitation, in the material of forming silicon oxide film of this invention, regarding the ratio of the substituent group which can be eliminated at a temperature ranging from 250° C. to the glass transition point of the material of forming silicon oxide film. Generally, the ratio of this substituent group may be suitably selected from the range of 0.01 to 90% based on the material of forming silicon oxide film. If the ratio of this leaving substituent group is less than 0.01%, it would be impossible to expect a sufficient effect that can be obtained by the addition of the leaving substituent group. On the other hand, if the ratio of this leaving substituent group exceeds over 90%, it would give rise to various problems regarding the quality, strength and electric properties of the resultant oxide film. Accordingly, a more preferable range of the ratio of this leaving substituent group is 0.1 to 50% based on the material of forming silicon oxide film.

Since the material of forming silicon oxide film according to this invention contains a silicone polymer comprising a substituent group which can be eliminated at a temperature ranging from 250° C. to the glass transition point of the material of forming silicon oxide film, the resultant silicon oxide film to be formed according to the method of this invention contains pores which are formed as a result of the elimination of the aforementioned substituent group. Namely, since the free volume can be increased in the silicon oxide film, it is possible to obtain a silicon oxide film exhibiting a lower dielectric constant. Moreover, since the heat resistance of the resultant oxide film is not affected at all, the silicon oxide film of this invention is highly suited for use as an insulating film in a semiconductor device.

This invention will be further explained with reference to the following examples, which are not intended to restrict this invention.

EXAMPLE I

Example I-1

0.5 g of trifluoropropyltrimethoxy silane, 9.5 g of methyltriethoxy silane, 10 g of isopropyl alcohol, 3.4 g of butanol, 3.4 g of water and 0.1 g of oxalic acid dihydrate were mixed together and then allowed to react for two hours at a temperature of 70° C. to obtain a copolymer represented by the following chemical formula. The molecular weight of this copolymer was found to be 3,200.

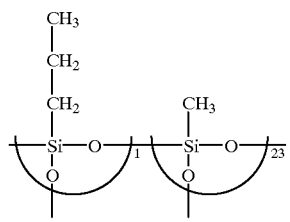

Subsequently, this copolymer was dissolved in a mixed solvent comprising 10 g of butanol and 3.4 g of isopropyl alcohol to obtain a polymer solution. This polymer solution was then spin-coated on a silicon substrate to form a film, the IR spectrum of which was then measured. As a result, the spectra of C—H, C—F and Si—O were recognized at 2,900 cm$^{-1}$, at 1,210 cm$^{-1}$, and at 1,050 to 1,200 cm$^{-1}$, respectively.

Subsequently, this polymer solution was spin-coated on a substrate and then heated for five minutes at a temperature of 100° C. to form a resin layer, which was then baked according to the following heating process to obtain a silicon oxide film. Namely, the resin layer was heated for one hour to raise the temperature of the resin layer from room temperature to 250° C., and then maintained at this temperature for one hour. Thereafter, the temperature of the resin layer was increased from 250° C. to 500° C. over one hour and then maintained at 500° C. for one hour.

The silicon oxide film thus obtained was found to have a density of 1.33. When the average pore diameter of the oxide film was measured by means of a BET method based on the low temperature/low humidity physical adsorption of nitrogen gas, it was found to be 2 nm.

Example I-2

0.5 g of trifluoropropyltriethoxy silane, 9.5 g of methyltriethoxy silane, 10 g of isopropyl alcohol, 3.4 g of butanol, 3.4 g of water and 0.1 g of oxalic acid dihydrate were mixed together and then allowed to react for two hours at a temperature of 70° C. to obtain a copolymer represented by the following chemical formula. The molecular weight of this copolymer was found to be 3,100.

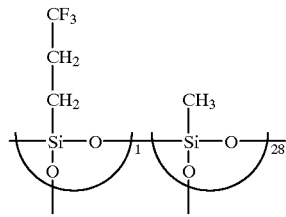

Subsequently, this copolymer was dissolved in a mixed solvent comprising 10 g of butanol and 3.4 g of isopropyl alcohol to obtain a polymer solution. This polymer solution was then spin-coated on a silicon substrate to form a film, the IR spectrum of which was then measured. As a result, the spectra of C—H, C—F and Si—O were recognized at 2,900 cm$^{-1}$, at 1,210 cm$^{-1}$, and at 1,050 to 1,200 cm$^{-1}$, respectively.

Subsequently, this polymer solution was spin-coated on a substrate and then heated for five minutes at a temperature of 100° C. to form a resin layer, which was then baked according to the following heating process to obtain a silicon oxide film. Namely, the resin layer was heated for one hour to raise the temperature of the resin layer from room temperature to 250° C., and then maintained at this temperature for one hour. Thereafter, the temperature of the resin layer was increased from 250° C. to 500° C. over one hour and then maintained at 500° C. for one hour.

The silicon oxide film thus obtained was found to have a density of 1.35. When the average pore diameter of the oxide film was measured by means of a BET method based on the low temperature/low humidity physical adsorption of nitrogen gas, it was found to be 1.9 nm.

Example I-3

0.5 g of trifluoropropyltrimethoxy silane, 9.5 g of tetraethoxy silane, 10 g of isopropyl alcohol, 3.4 g of butanol, 3.4 g of water and 0.1 g of oxalic acid dihydrate were mixed together and then allowed to react for two hours at a temperature of 70° C. to obtain a copolymer represented by the following chemical formula. The molecular weight of this copolymer was found to be 3,500.

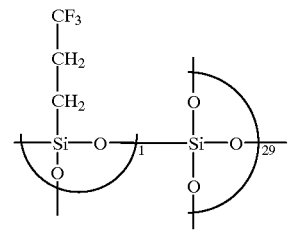

Subsequently, this copolymer was dissolved in a mixed solvent comprising 10 g of butanol and 3.4 g of isopropyl alcohol to obtain a polymer solution. This polymer solution was then spin-coated on a silicon substrate to form a film, the IR spectrum of which was then measured. As a result, the spectra of C—F and Si—O were recognized at 1,210 cm$^{-1}$, and at 1,050 to 1,200 cm$^{-1}$, respectively.

Subsequently, this polymer solution was spin-coated on a substrate and then heated for five minutes at a temperature of 100° C. to form a resin layer, which was then baked according to the following heating process to obtain a silicon oxide film. Namely, the resin layer was heated for one hour to raise the temperature of the resin layer from room temperature to 250° C., and then maintained at this temperature for one hour. Thereafter, the temperature of the resin layer was increased from 250° C. to 500° C. over one hour and then maintained at 500° C. for one hour.

The silicon oxide film thus obtained was found to have a density of 1.42. When the average pore diameter of the oxide film was measured by means of a BET method based on the low temperature/low humidity physical adsorption of nitrogen gas, it was found to be 1.9 nm.

Example I-4

1.0 g of trifluoropropyltrimethoxy silane, 9.0 g of methyltriethoxy silane, 10 g of isopropyl alcohol, 3.4 g of butanol, 3.4 g of water and 0.1 g of oxalic acid dihydrate were mixed together and then allowed to react for two hours at a temperature of 70° C. to obtain a copolymer represented by the following chemical formula. The molecular weight of this copolymer was found to be 3,300.

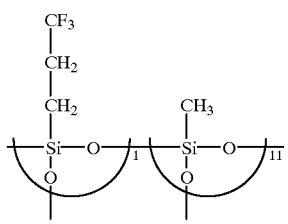

Subsequently, this copolymer was dissolved in a mixed solvent comprising 10 g of butanol and 3.4 g of isopropyl alcohol to obtain a polymer solution. This polymer solution was then spin-coated on a silicon substrate to form a film, the IR spectrum of which was then measured. As a result, the spectra of C—H, C—F and Si—O were recognized at 2,900 cm$^{-1}$, at 1,210 cm$^{-1}$, and at 1,050 to 1,200 cm$^{-1}$, respectively.

Subsequently, this polymer solution was spin-coated on a substrate and then heated for five minutes at a temperature of 100° C. to form a resin layer, which was then baked according to the following heating process to obtain a silicon oxide film. Namely, the resin layer was heated for one hour to raise the temperature of the resin layer from room temperature to 250° C., and then maintained at this temperature for one hour. Thereafter, the temperature of the resin layer was increased from 250° C. to 500° C. over one hour and then maintained at 500° C. for one hour.

The silicon oxide film thus obtained was found to have a density of 1.30. When the average pore diameter of the oxide film was measured by means of a BET method based on the low temperature/low humidity physical adsorption of nitrogen gas, it was found to be 1.9 nm.

Example I-5

21.8 g (0.1 mol) of trifluoropropyltrimethoxy silane, 100 mL of methylisobutyl ketone, 27 g of water and HCl (0.001 mol) were mixed together and then allowed to react for three hours at a temperature of 80° C. Subsequently, the reaction product was kept under a reduced pressure for 8 hours by means of a vacuum pump, and allowed to re-precipitate to refine the reaction product, thus obtaining a fluorine-containing silicone resin represented by the following chemical formula. The molecular weight of this polymer was found to be 2,800.

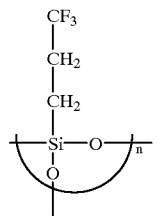

wherein n denotes a polymerization degree.

Subsequently, 0.1 g of this fluorine-containing silicone resin was mixed in 10 g of hydrogensilsesquioxane (FOX15, Dow Corning Co., Ltd.) to obtain a resin composition.

Subsequently, this polymer solution was spin-coated on a substrate and then heated for five minutes at a temperature of 100° C. to form a resin layer, which was then baked according to the following heating process to obtain a silicon oxide film. Namely, the resin layer was heated for one hour to raise the temperature of the resin layer from room temperature to 250° C., and then maintained at this temperature for one hour. Thereafter, the temperature of the resin layer was increased from 250° C. to 500° C. over one hour and then maintained at 500° C. for one hour.

The silicon oxide film thus obtained was found to have a density of 1.25. When the average pore diameter of the oxide film was measured by means of a BET method based on the low temperature/low humidity physical adsorption of nitrogen gas, it was found to be 2 nm.

Example I-6

23.2 g (0.1 mol) of trifluoropropyl trichlorosilane, 100 mL of methylisobutyl ketone, 27 g of water and 30.3 g (0.3 mol) of trimethyl amine were mixed together and then allowed to react for three hours at a temperature of 80° C. to obtain a reaction mixture. Subsequently, 10.1 g (0.1 mol) of triethyl amine and 0.1 mol of trimethyl chlorosilane were added to the reaction mixture, and allowed to react for 8 hours at a temperature of 70° C. Then, after the solvents were allowed to evaporate, the reaction mixture was allowed to react again for one hour. The resultant reaction product was then kept under a reduced pressure for 8 hours by means of a vacuum pump, and allowed to re-precipitate to refine the reaction product, thus obtaining a fluorine-containing silicone resin represented by the following chemical formula. The molecular weight of this polymer was found to be 4,500.

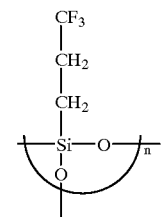

wherein n denotes a polymerization degree.

Subsequently, 0.1 g of this fluorine-containing silicone resin was mixed in 10 g of hydrogensilsesquioxane (FOX15, Dow Corning Co., Ltd.) to obtain a resin composition.

Subsequently, this polymer solution was spin-coated on a substrate and then heated for five minutes at a temperature of 100° C. to form a resin layer, which was then baked according to the following heating process to obtain a silicon oxide film. Namely, the resin layer was heated for one hour to raise the temperature of the resin layer from room temperature to 250° C., and then maintained at this temperature for one hour. Thereafter, the temperature of the resin layer was increased from 250° C. to 500° C. over one hour and then maintained at 500° C. for one hour.

The silicon oxide film thus obtained was found to have a density of 1.25. When the average pore diameter of the oxide film was measured by means of a BET method based on the low temperature/low humidity physical adsorption of nitrogen gas, it was found to be 2 nm.

Example I-7

0.5 g of t-butyltrimethoxy silane, 9.5 g of methyltriethoxy silane, 10 g of isopropyl alcohol, 3.4 g of butanol, 3.4 g of water and 0.1 g of oxalic acid dihydrate were mixed together and then allowed to react for two hours at a temperature of 70° C. to obtain a copolymer represented by the following chemical formula. The molecular weight of this copolymer was found to be 3,000.

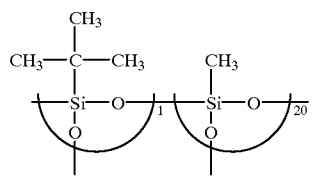

Subsequently, this copolymer was dissolved in a mixed solvent comprising 10 g of butanol and 3.4 g of isopropyl alcohol to obtain a polymer solution. This polymer solution was then spin-coated on a silicon substrate to form a film, the IR spectrum of which was then measured. As a result, the spectra of C—H and Si—O were recognized at 2,900 cm$^{-1}$, and at 1,050 to 1,200 cm$^{-1}$, respectively.

Subsequently, this polymer solution was spin-coated on a substrate and then heated for five minutes at a temperature of 100° C. to form a resin layer, which was then baked according to the following heating process to obtain a silicon oxide film. Namely, the resin layer was heated for one hour to raise the temperature of the resin layer from room temperature to 250° C., and then maintained at this temperature for one hour. Thereafter, the temperature of the resin layer was increased from 250° C. to 500° C. over one hour and then maintained at 500° C. for one hour.

The silicon oxide film thus obtained was found to have a density of 1.3. When the average pore diameter of the oxide film was measured by means of a BET method based on the low temperature/low humidity physical adsorption of nitrogen gas, it was found to be 2.1 nm.

Example I-8

0.5 g of trifluoropropyltrimethoxy silane was mixed in 10 g of OCD type 11 (Tokyo Ohka Kogyo Co., Ltd.) to obtain a resin composition.

Subsequently, this polymer solution was spin-coated on a substrate and then heated for five minutes at a temperature of 100° C. to form a resin layer, which was then baked according to the following heating process to obtain a silicon oxide film. Namely, the resin layer was heated for one hour to raise the temperature of the resin layer from room temperature to 250° C., and then maintained at this temperature for one hour. Thereafter, the temperature of the resin layer was increased from 250° C. to 500° C. over one hour and then maintained at 500° C. for one hour.

The silicon oxide film thus obtained was found to have a density of 1.35. When the average pore diameter of the oxide film was measured by means of a BET method based on the low temperature/low humidity physical adsorption of nitrogen gas, it was found to be 2 nm.

Example I-9

A mixture consisting of 3.75 mol of sulfuric acid and 2.25 mol of fuming sulfuric acid was heated at a temperature of 50° C. and at the same time, 6 mol of toluene was added dropwise over one hour, after which the resultant mixture was allowed to react for 30 minutes. Subsequently, the temperature of the reaction solution was lowered to 30° C., and then a mixture consisting of 0.9 mol of trichlorosilane, 0.1 mol of trifluoropropyl trichlorosilane and 6.6 mol of toluene was added dropwise into the above reaction mixture over 5 hours. The resultant mixed solution was allowed to react for 30 minutes, and then left to cool. After the product phase was separated, the product phase was quenched with dilute sulfuric acid and then washed with water. After water was completely removed from the product phase, the solvent therein was removed under a reduced pressure thereby to obtain a copolymer represented by the following chemical formula. The molecular weight of this copolymer was found to be 9,000.

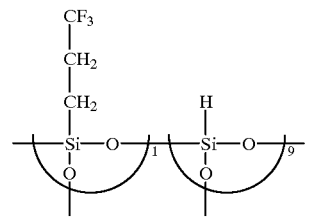

Subsequently, this copolymer was dissolved in methyl-isobutyl ketone to obtain a 15 wt. % polymer solution. This polymer solution was then spin-coated on a silicon substrate to form a film, the IR spectrum of which was then measured. As a result, the spectra of C—H, C—F, Si—H and Si—O were recognized at 2,900 cm$^{-1}$, at 1,210 cm$^{-1}$, at 2,200 cm$^{-1}$, and at 1,050 to 1,200 cm$^{-1}$, respectively.

Subsequently, this polymer solution was spin-coated on a substrate and then heated for five minutes at a temperature of 100° C. to form a resin layer, which was then baked according to the following heating process to obtain a silicon oxide film. Namely, the resin layer was heated for one hour to raise the temperature of the resin layer from room temperature to 250° C., and then maintained at this temperature for one hour. Thereafter, the temperature of the resin layer was increased from 250° C. to 500° C. over one hour and then maintained at 500° C. for one hour.

The silicon oxide film thus obtained was found to have a density of 1.22. When the average pore diameter of the oxide film was measured by means of a BET method based on the low temperature/low humidity physical adsorption of nitrogen gas, it was found to be 2 nm.

Example I-10

A mixture consisting of 3.75 mol of sulfuric acid and 2.25 mol of fuming sulfuric acid was heated at a temperature of 50° C. and at the same time, 6 mol of toluene was added dropwise over one hour, after which the resultant mixture was allowed to react for 30 minutes. Subsequently, the temperature of the reaction solution was lowered to 30° C., and then a mixture consisting of 0.8 mol of trichlorosilane, 0.2 mol of trifluoropropyl trichlorosilane and 6.6 mol of toluene was added dropwise into the above reaction mixture over 5 hours. The resultant mixed solution was allowed to react for 30 minutes, and then left to cool. After the product phase was separated, the product phase was quenched with dilute sulfuric acid and then washed with water. After water was completely removed from the product phase, the solvent therein was removed under a reduced pressure thereby to obtain a copolymer represented by the following chemical formula. The molecular weight of this copolymer was found to be 8,000.

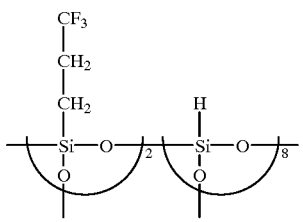

Subsequently, this copolymer was dissolved in methylisobutyl ketone to obtain a 15 wt. % polymer solution. This polymer solution was then spin-coated on a silicon substrate to form a film, the IR spectrum of which was then measured. As a result, the spectra of C—H, Si—H, C—F and Si—O were recognized at 2,900 cm$^{-1}$, at 2,200 cm$^{-1}$, at 1,210 cm$^{-1}$, and at 1,050 to 1,200 cm$^{-1}$, respectively.

Subsequently, this polymer solution was spin-coated on a substrate and then heated for five minutes at a temperature of 100° C. to form a resin layer, which was then baked according to the following heating process to obtain a silicon oxide film. Namely, the resin layer was heated for one hour to raise the temperature of the resin layer from room temperature to 250° C., and then maintained at this temperature for one hour. Thereafter, the temperature of the resin layer was increased from 250° C. to 500° C. over one hour and then maintained at 500° C. for one hour.

The silicon oxide film thus obtained was found to have a density of 1.15 When the average pore diameter of the oxide film was measured by means of a BET method based on the low temperature/low humidity physical adsorption of nitrogen gas, it was found to be 2 nm.

Example I-11

23.2 g (0.1 mol) of trifluoropropyl trichlorosilane, 100 mL of methylisobutyl ketone, 27 g of water and 30.3 g (0.3 mol) of trimethyl amine were mixed together and then allowed to react for three hours at a temperature of 80° C. to obtain a reaction mixture. Subsequently, 10.g (0.1 mol) of triethyl amine and 0.1 mol of trimethyl chlorosilane were added to the reaction mixture, and allowed to react for 8 hours at a temperature of 70° C. Then, after the solvents were allowed to evaporate, the reaction mixture was allowed to react again for one hour. The resultant reaction product was then kept under a reduced pressure for 8 hours by means of a vacuum pump, and allowed to re-precipitate to refine the reaction product, thus obtaining a fluorine-containing silicone resin represented by the following chemical formula. The molecular weight of this polymer was found to be 8,000.

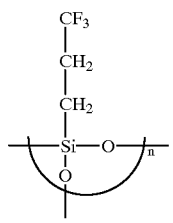

wherein n denotes a polymerization degree.

Subsequently, this polymer was dissolved in methylisobutyl ketone to obtain a 15 wt. % polymer solution. This polymer solution was then spin-coated on a silicon substrate to form a film, the IR spectrum of which was then measured. As a result, the spectra of C—H, C—F and Si—O were recognized at 2,900 cm$^{-1}$, at 1,210 cm$^{-1}$, and at 1,050 to 1,200 cm$^{-1}$, respectively.

Subsequently, this polymer solution was spin-coated on a substrate and then heated for five minutes at a temperature of 100° C. to form a resin layer, which was then baked according to the following heating process to obtain a silicon oxide film. Namely, the resin layer was heated for one hour to raise the temperature of the resin layer from room temperature to 250° C., and then maintained at this temperature for one hour. Thereafter, the temperature of the resin layer was increased from 250° C. to 500° C., over one hour and then maintained at 500° C. for one hour.

The silicon oxide film thus obtained was found to have a density of 1.0 When the average pore diameter of the oxide film was measured by means of a BET method based on the low temperature/low humidity physical adsorption of nitrogen gas, it was found to be 2 nm.

Example I-12

0.5 g of trifluoropropylmethyldimethoxy silane, 9.5 g of tetraethoxy silane, 10 g of isopropyl alcohol, 3.4 g of butanol, 3.4 g of water and 0.1 g of oxalic acid dihydrate were mixed together and then allowed to react for two hours at a temperature of 70° C. to obtain a copolymer represented by the following chemical formula. The molecular weight of this copolymer was found to be 8,500.

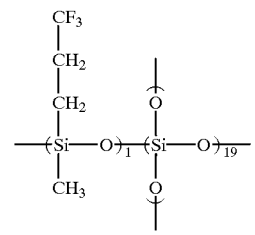

Subsequently, this copolymer was dissolved in a mixed solvent comprising 10 g of butanol and 3.4 g of isopropyl alcohol to obtain a polymer solution. This polymer solution was then spin-coated on a silicon substrate to form a film, the IR spectrum of which was then measured. As a result, the spectra of C—H, C—F and Si—O were recognized at 2,900 cm$^{-1}$, at 1,210 cm$^{-1}$, and at 1,050 to 1,200 cm$^{-1}$, respectively.

Subsequently, this polymer solution was spin-coated on a substrate and then heated for five minutes at a temperature of 100° C. to form a resin layer, which was then baked according to the following heating process to obtain a silicon oxide film. Namely, the resin layer was heated for one hour to raise the temperature of the resin layer from room temperature to 250° C., and then maintained at this temperature for one hour. Thereafter, the temperature of the resin layer was increased from 250° C. to 500° C. over one hour and then maintained at 500° C. for one hour.

The silicon oxide film thus obtained was found to have a density of 1.35. When the average pore diameter of the oxide film was measured by means of a BET method based on the low temperature/low humidity physical adsorption of nitrogen gas, it was found to be 1.9 nm.

Example I-13

0.5 g of ditrifluoropropyldimethoxy silane, 9.5 g of tetraethoxy silane, 10 g of isopropyl alcohol, 3.4 g of butanol, 3.4 g of water and 0.1 g of oxalic acid dihydrate were mixed together and then allowed to react for two hours at a temperature of 70° C. to obtain a copolymer represented by the following chemical formula. The molecular weight of this copolymer was found to be 9,000.

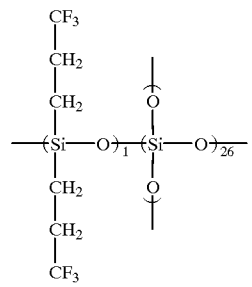

Subsequently, this copolymer was dissolved in a mixed solvent comprising 10 g of butanol and 3.4 g of isopropyl alcohol to obtain a polymer solution. This polymer solution was then spin-coated on a silicon substrate to form a film, the IR spectrum of which was then measured. As a result, the spectra of C—H, C—F and Si—O were recognized at 2,900 $cm^{-1}$, at 1,210 $cm^{-1}$, and at 1,050 to 1,200 $cm^{-1}$, respectively.

Subsequently, this polymer solution was spin-coated on a substrate and then heated for five minutes at a temperature of 100° C. to form a resin layer, which was then baked according to the following heating process to obtain a silicon oxide film. Namely, the resin layer was heated for one hour to raise the temperature of the resin layer from room temperature to 250° C., and then maintained at this temperature for one hour. Thereafter, the temperature of the resin layer was increased from 250° C. to 500° C. over one hour and then maintained at 500° C. for one hour.

The silicon oxide film thus obtained was found to have a density of 1.25. When the average pore diameter of the oxide film was measured by means of a BET method based on the low temperature/low humidity physical adsorption of nitrogen gas, it was found to be 2 nm.

Then, materials of forming silicon oxide film thus obtained were employed to form silicon oxide films respectively, and the dielectric constant of each oxide film was measured as explained below.

Example I-14

The material of forming silicon oxide film obtained in Example I-1 was spin-coated on a silicon substrate and then pre-cured for 3 minutes at a temperature of 100° C. Thereafter, the oxide layer was baked at a temperature of 150° C. for one hour, at a temperature of 250° C. for one hour, at a temperature of 350° C. for one hour, and then at a temperature of 450° C. for three hours to obtain a silicon oxide film. When the dielectric constant of this silicon oxide film was measured, it was found to be 2.0.

Example I-15

A silicon oxide film was formed in the same manner as explained in Example I-14 except that the material of forming silicon oxide film obtained in Example I-3 was employed. When the dielectric constant of the resultant silicon oxide film was measured, it was found to be 2.1.

Example I-16

A silicon oxide film was formed in the same manner as explained in Example I-14 except that the material of forming silicon oxide film obtained in Example I-6 was employed. When the dielectric constant of the resultant silicon oxide film was measured, it was found to be 2.0.

Example I-17

A silicon oxide film was formed in the same manner as explained in Example I-14 except that the material of forming silicon oxide film obtained in Example I-7 was employed. When the dielectric constant of the resultant silicon oxide film was measured, it was found to be 2.3.

Example I-18

A silicon oxide film was formed in the same manner as explained in Example I-14 except that the material of forming silicon oxide film obtained in Example I-9 was employed. When the dielectric constant of the resultant silicon oxide film was measured, it was found to be 2.1.

Example I-19

A silicon oxide film was formed in the same manner as explained in Example I-14 except that the material of forming silicon oxide film obtained in Example I-10 was employed. When the dielectric constant of the resultant silicon oxide film was measured, it was found to be 2.1.

Example I-20

A silicon oxide film was formed in the same manner as explained in Example I-14 except that the material of forming silicon oxide film obtained in Example I-11 was employed. When the dielectric constant of the resultant silicon oxide film was measured, it was found to be 2.0.

The followings are explanations on the manufacture of a semiconductor device which was performed by applying the method of forming the silicon oxide film of this invention to the manufacture of an insulating film.

Example I-21

FIG. 1 shows a cross-sectional view of one example of LSI wherein an interlayer insulating film is formed of a silicon oxide film which has been formed according to the method of this invention. The LSI shown in FIG. 1 comprises a silicon wafer 1 provided on the surface thereof with a thermal oxide film 2, on which an aluminum wiring 3, an interlayer insulating film 4

According to this example, a silicon oxide film functioning as the interlayer insulating film 4 was formed according the method described in the afore-mentioned Example I-14. Since the dielectric constant of the interlayer insulating film 4 was as low as 2.0, the LSI thus obtained exhibited a high reliability and a high operation speed. Furthermore, since the interlayer insulating film 4 formed in accordance with the method of this invention did not reflect on the uneven underlying surface in contrast to the interlayer insulating film to be formed by means of CVD method, the interlayer insulating film 4 was not substantially influenced by the step portions of the aluminum wiring 3, thus flattening the surface of the oxide film and making it possible to obtain a wiring structure of high reliability.

Example I-22

An LSI was manufactured in the same manner as explained in Example I-21 except that the interlayer insulating film 4 was formed according to the method described in Example I-16. As a result, it was possible to obtain an LSI exhibiting high reliability and high operation speed.

Example I-23

An LSI was manufactured in the same manner as explained in Example I-21 except that the interlayer insulating film 4 was formed according to the method described in Example I-18. As a result, it was possible to obtain an LSI exhibiting high reliability and high operation speed.

Example I-24

Figure 2:
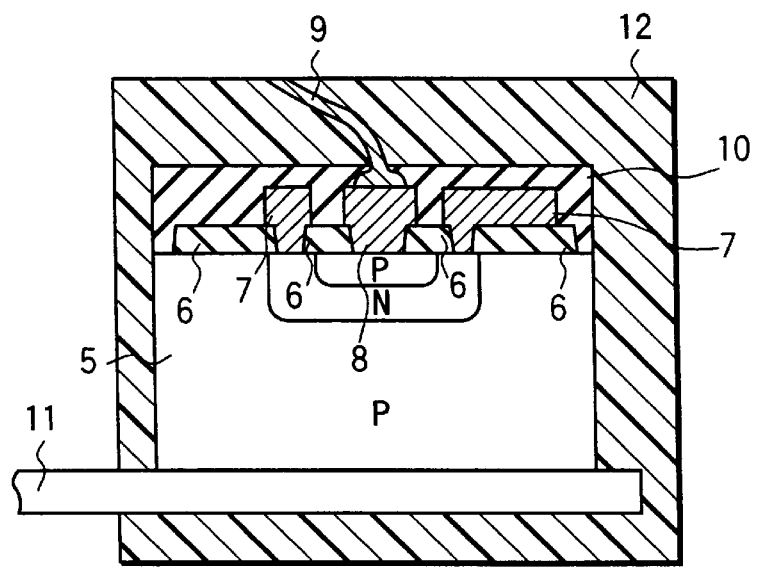
FIG. 2 is a cross-sectional view of one example of semiconductor element provided with a passivation film consisting of a silicon oxide film which has been formed according to the method of this invention.

FIG. 2 shows a cross-sectional view of one example of semiconductor element wherein a passivation film is formed of a silicon oxide film which has been formed according to the method of this invention. The semiconductor element shown in FIG. 2 comprises a silicon semiconductor substrate 5 disposed on a dovelead 11 and provided on its surface with a PNP type transistor, silicon dioxide films 6 protecting the junctions between an emitter and a base, and between a base and a collector, a base electrode 7 formed of an aluminum film, and an emitter electrode 8 formed of an aluminum film. The emitter electrode 8 is connected with a lead wire via a bonding wire 9 made of gold or aluminum. The base electrode 7 and emitter electrode 8 are covered by a passivation film 10. The silicon semiconductor substrate constructed as mentioned above is encapsulated together with the dovelead 11 by a sealing resin 12 for the purpose of ensuring the mechanical strength thereof as well as for the purpose of protecting it from the outer atmosphere.

According to this example, a silicon oxide film functioning as the passivation film 10 was formed according the method described in the aforementioned Example I-15. Since the dielectric constant of the silicon oxide film was as low as 2.0, the semiconductor element thus obtained exhibited a high reliability and a high operation speed. It was also confirmed that there was little possibility of producing a defective product during the manufacture of the semiconductor element.

Example I-25

Figure 3:
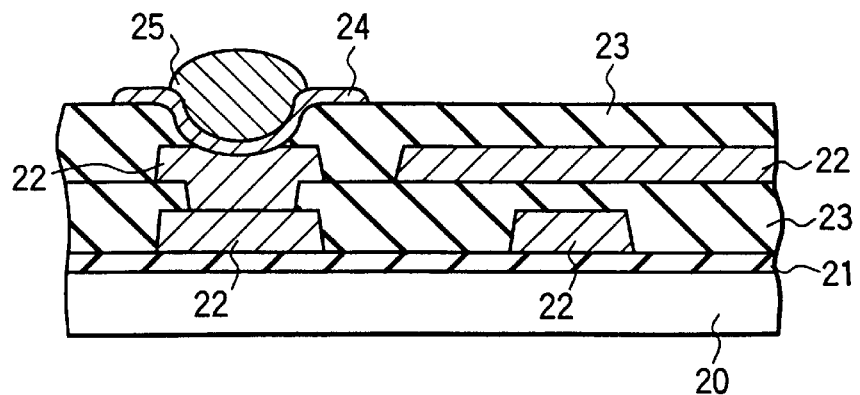
FIG. 3 is a cross-sectional view of one example of multi-chip module provided with an interlayer insulating film consisting of a silicon oxide film which has been formed according to the method of this invention.

FIG. 3 shows a cross-sectional view of one example of multi-chip module wherein a silicon oxide film which has been formed according to the method of this invention is employed as an interlayer insulating film. The multi-chip module shown in FIG. 3 comprises a silicon wafer 20 having a thermal oxide film 21 formed on its surface, on which a copper wiring 22, an interlayer insulating film 23 and a copper wiring 22 are successively laminated. One of the copper wiring 22 is connected, via another copper wiring 22 deposited thereon and a Pb/Sn electrode 24, with a BLM (Ball Limiting Metallization) 25.

According to this example, a silicon oxide film functioning as the interlayer insulating film 23 was formed according the method described in the afore-mentioned Example I-14. Since the dielectric constant of the interlayer insulating film 23 was as low as 2.1, the device thus obtained exhibited a high operation speed. Furthermore, since the step portions of the copper wiring 22 could be greatly absorbed by the oxide film, it was possible to form an insulating film having a flat surface, thus improving the reliability of the device.

Example I-26

A multi-chip module was manufactured in the same manner as explained in Example I-25 except that the interlayer insulating film 23 was formed according to the method described in Example I-18. As a result, it was possible to obtain a multi-chip module exhibiting high reliability and high operation speed.

Example I-27

3 g of trifluoropropyltrimethoxy silane, 7 g of methyltriethoxy silane, 20 g of isopropyl alcohol, 1.51 g of titanium tetraisopropoxide, 3.4 g of butanol, 3.4 g of distilled water and 0.1 g of oxalic acid dihydrate were mixed together and then allowed to react for two hours at a temperature of 70° C. to obtain a copolymer represented by the following chemical formula. The molecular weight of this copolymer was found to be 4,000.

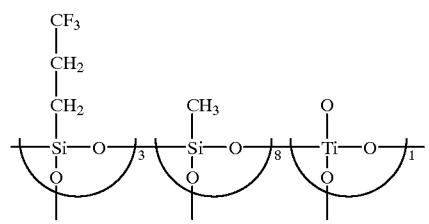

Subsequently, this copolymer was dissolved in 10 g of isopropyl alcohol to obtain a polymer solution. This polymer solution was then spin-coated on a silicon substrate to form a film, the IR spectrum of which was then measured. As a result, the spectra of C—H, C—F and Si—O were recognized at 2,900 cm$^{-1}$, at 1,210 cm$^{-1}$, and at 1,050 to 1,200 cm$^{-1}$, respectively.

Subsequently, this polymer solution was spin-coated on a substrate and then heated for five minutes at a temperature of 100° C. to form a resin layer, which was then baked according to the following heating process to obtain a silicon oxide film. Namely, the resin layer was heated for one hour to raise the temperature of the resin layer from room temperature to 250° C., and then maintained at this temperature for one hour. Thereafter, the temperature of the resin layer was increased from 250° C. to 500° C. over one hour and then maintained at 500° C. for one hour.

The silicon oxide film thus obtained was found to have a density of 1.1. When the average pore diameter of the oxide film was measured by means of a BET method based on the low temperature/low humidity physical adsorption of nitrogen gas, it was found to be 1.9 nm.

Example I-28

3 g of trifluoropropyltrimethoxy silane, 7 g of methyltriethoxy silane, 20 g of isopropyl alcohol, 1.93 g of titanium diisopropoxide bis(2,4-pentane dionate), 3.4 g of butanol, 3.4 g of distilled water and 0.1 g of oxalic acid dihydrate were mixed together and then allowed to react for two hours at a temperature of 70° C. to obtain a copolymer represented by the following chemical formula. The molecular weight of this copolymer was found to be 3,700.

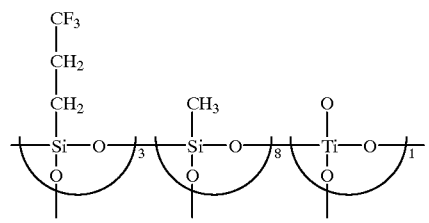

Subsequently, this copolymer was dissolved in 10 g of isopropyl alcohol to obtain a polymer solution. This polymer solution was then spin-coated on a silicon substrate to form a film, the IR spectrum of which was then measured. As a result, the spectra of C—H, C—F and Si—O were recognized at 2,900 cm$^{-1}$, at 1,210 cm$^{-1}$, and at 1,050 to 1,200 cm$^{-1}$, respectively.

Subsequently, this polymer solution was spin-coated on a substrate and then heated for five minutes at a temperature of 100° C. to form a resin layer, which was then baked according to the following heating process to obtain a silicon oxide film. Namely, the resin layer was heated for one hour to raise the temperature of the resin layer from room temperature to 250° C., and then maintained at this temperature for one hour. Thereafter, the temperature of the resin layer was increased from 250° C. to 500° C. over one hour and then maintained at 500° C. for one hour.

The silicon oxide film thus obtained was found to have a density of 1.1. When the average pore diameter of the oxide film was measured by means of a BET method based on the low temperature/low humidity physical adsorption of nitrogen gas, it was found to be 2 nm.

Example I-29

3 g of trifluoropropyltrimethoxy silane, 7 g of methyltriethoxy silane, 20 g of isopropyl alcohol, 1.72 g of aluminum tri(2,4-pentane dionate), 3.4 g of butanol, 3.4 g of distilled water and 0.1 g of oxalic acid dihydrate were mixed together and then allowed to react for two hours at a temperature of 70° C. to obtain a copolymer represented by the following chemical formula. The molecular weight of this copolymer was found to be 3,000.

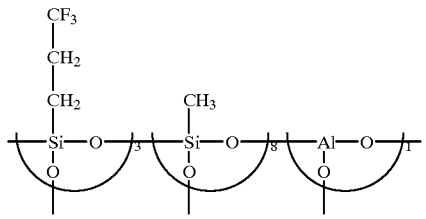

Subsequently, this copolymer was dissolved in 10 g of isopropyl alcohol to obtain a polymer solution. This polymer solution was then spin-coated on a silicon substrate to form a film, the IR spectrum of which was then measured. As a result, the spectra of C—H, C—F and Si—O were recognized at 2,900 cm$^{-1}$, at 1,210 cm$^{-1}$, and at 1,050 to 1,200 cm$^{-1}$, respectively.

Subsequently, this polymer solution was spin-coated on a substrate and then heated for five minutes at a temperature of 100° C. to form a resin layer, which was then baked according to the following heating process to obtain a silicon oxide film. Namely, the resin layer was heated for one hour to raise the temperature of the resin layer from room temperature to 250° C., and then maintained at this temperature for one hour. Thereafter, the temperature of the resin layer was increased from 250° C. to 500° C. over one hour and then maintained at 500° C. for one hour.

The silicon oxide film thus obtained was found to have a density of 1.1. When the average pore diameter of the oxide film was measured by means of a BET method based on the low temperature/low humidity physical adsorption of nitrogen gas, it was found to be 2 nm.

Example I-30

3 g of trifluoropropyltrimethoxy silane, 7 g of methyltriethoxy silane, 20 g of isopropyl alcohol, 2.53 g of zirconium isopropoxideisopropanol complex, 3.4 g of butanol, 3.4 g of distilled water and 0.1 g of oxalic acid dihydrate were mixed together and then allowed to react for two hours at a temperature of 70° C. to obtain a copolymer represented by the following chemical formula. The molecular weight of this copolymer was found to be 3,500.

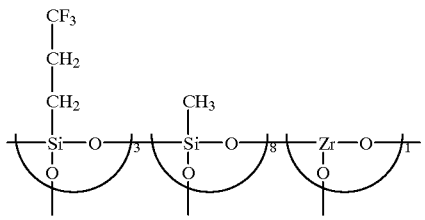

Subsequently, this copolymer was dissolved in 10 g of isopropyl alcohol to obtain a polymer solution. This polymer solution was then spin-coated on a silicon substrate to form a film, the IR spectrum of which was then measured. As a result, the spectra of C—H, C—F and Si—O were recognized at 2,900 cm$^{-1}$, at 1,210 cm$^{-1}$, and at 1,050 to 1,200 cm$^{-1}$, respectively.

Subsequently, this polymer solution was spin-coated on a substrate and then heated for five minutes at a temperature of 100° C. to form a resin layer, which was then baked according to the following heating process to obtain a silicon oxide film. Namely, the resin layer was heated for one hour to raise the temperature of the resin layer from room temperature to 250° C., and then maintained at this temperature for one hour. Thereafter, the temperature of the resin layer was increased from 250° C. to 500° C. over one hour and then maintained at 500° C. for one hour.

The silicon oxide film thus obtained was found to have a density of 1.1. When the average pore diameter of the oxide film was measured by means of a BET method based on the low temperature/low humidity physical adsorption of nitrogen gas, it was found to be 1.9 nm.

Example I-31

3 g of trifluoropropyltrimethoxy silane, 7 g of methyltriethoxy silane, 20 g of isopropyl alcohol, 2.45 g of tungsten (VI) ethoxide, 3.4 g of butanol, 3.4 g of distilled water and 0.1 g of oxalic acid dihydrate were mixed together and then allowed to react for two hours at a temperature of 70° C. to obtain a copolymer represented by the following chemical formula. The molecular weight of this copolymer was found to be 3,200.

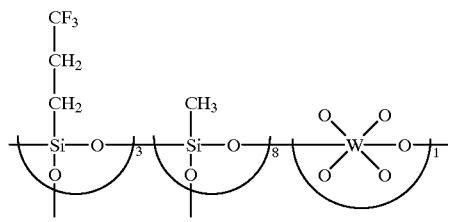

Subsequently, this copolymer was dissolved in 10 g of isopropyl alcohol to obtain a polymer solution. This polymer solution was then spin-coated on a silicon substrate to form a film, the IR spectrum of which was then measured. As a result, the spectra of C—H, C—F and Si—O were recognized at 2,900 cm$^{-1}$, at 1,210 cm$^{-1}$, and at 1,050 to 1,200 cm$^{-1}$, respectively.

Subsequently, this polymer solution was spin-coated on a substrate and then heated for five minutes at a temperature of 100° C. to form a resin layer, which was then baked according to the following heating process to obtain a silicon oxide film. Namely, the resin layer was heated for one hour to raise the temperature of the resin layer from room temperature to 250° C., and then maintained at this temperature for one hour. Thereafter, the temperature of the resin layer was increased from 250° C. to 500° C. over one hour and then maintained at 500° C. for one hour.

The silicon oxide film thus obtained was found to have a density of 1.12. When the average pore diameter of the oxide film was measured by means of a BET method based on the low temperature/low humidity physical adsorption of nitrogen gas, it was found to be 2 nm.

Example I-32

The material of forming silicon oxide film obtained in Example I-27 was spin-coated on a silicon substrate and then pre-cured for 3 minutes at a temperature of 100° C. Thereafter, the oxide layer was baked at a temperature of 150° C. for one hour, at a temperature of 250° C. for one hour, at a temperature of 350° C. for one hour, and then at a temperature of 450° C. for three hours to obtain a silicon oxide film. When the dielectric constant of this silicon oxide film was measured, it was found to be 2.2.

Example I-33

A silicon oxide film was formed in the same manner as explained in Example I-32 except that the material of forming silicon oxide film obtained in Example I-28 was employed. When the dielectric constant of the resultant silicon oxide film was measured, it was found to be 2.1.

Example I-34

A silicon oxide film was formed in the same manner as explained in Example I-32 except that the material of forming silicon oxide film obtained in Example I-29 was employed. When the dielectric constant of the resultant silicon oxide film was measured, it was found to be 2.2.

Example I-35

A silicon oxide film was formed in the same manner as explained in Example I-32 except that the material of forming silicon oxide film obtained in Example I-30 was employed. When the dielectric constant of the resultant silicon oxide film was measured, it was found to be 2.3.

Example I-36

A silicon oxide film was formed in the same manner as explained in Example I-32 except that the material of forming silicon oxide film obtained in Example I-31 was employed. When the dielectric constant of the resultant silicon oxide film was measured, it was found to be 2.2.

The followings are explanations on the manufacture of a semiconductor device which was performed by applying the method of forming the silicon oxide film of this invention to the manufacture of an insulating film.

Example I-37

An LSI was manufactured in the same manner as explained in Example I-21 except that the interlayer insulating film 4 was formed according to the method described in Example I-32. As a result, it was possible to obtain an LSI exhibiting high reliability and high operation speed.

Example I-38

An LSI was manufactured in the same manner as explained in Example I-21 except that the interlayer insulating film 4 was formed according to the method described in Example I-34. As a result, it was possible to obtain an LSI exhibiting high reliability and high operation speed.

Example I-39

An LSI was manufactured in the same manner as explained in Example I-21 except that the interlayer insulating film 4 was formed according to the method described in Example I-35. As a result, it was possible to obtain an LSI exhibiting high reliability and high operation speed.

EXAMPLE II

Example II-1

The interior of reaction system of 500 mL four-necked flask equipped with a gas inlet tube, a mechanical stirrer, a condenser and a dropping funnel was purged with nitrogen gas. Then, 19.7 g (0.1 mol) of trifluoropropyl dichlorosilane and 100 mL of dichloromethane were placed in the flask, into which 80 g of pyridine was further added dropwise. Into the resultant reaction mixture was introduced 8.5 g (0.5 mol) of ammonia gas together with nitrogen gas.

After finishing the introduction of ammonia gas, the reaction mixture was allowed to further react for one hour and then filtered. Subsequently, the solvent was removed under a reduced pressure thereby to obtain 12.8 g (yield: 91%) of polytrifluoropropyl(hydro)silazane. This polymer was found to have a repeating unit represented by the following chemical formula, and a molecular weight of 2,500.

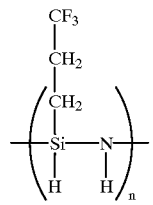

wherein n denotes a polymerization degree.

Subsequently, 2 g of this polymer was dissolved in 8 g of xylene to obtain a resin composition. This polymer solution was then spin-coated on a silicon substrate to form a film, the IR spectrum of which was then measured. As a result, the spectra of N—H, C—H, Si—H, C—F and N—H were recognized at 3,400 cm$^{-1}$, at 3,000 cm$^{-1}$, at 2,100 cm$^{-1}$, at 1,210 cm$^{-1}$, and at 1,120 cm$^{-1}$, respectively.

Subsequently, this polymer solution was spin-coated on a substrate and then heated for five minutes at a temperature of 100° C. to form a resin layer, which was then baked according to the following heating process to obtain a silicon oxide film. Namely, the resin layer was heated for one hour to raise the temperature of the resin layer from room temperature to 250° C., and then maintained at this temperature for one hour. Thereafter, the temperature of the resin layer was increased from 250° C. to 500° C. over one hour and then maintained at 500° C. for one hour.

The silicon oxide film thus obtained was found to have a density of 1.0. When the average pore diameter of the oxide film was measured by means of a BET method based on the low temperature/low humidity physical adsorption of nitrogen gas, it was found to be 2.1 nm.

Example II-2

The interior of reaction system of 500 mL four-necked flask equipped with a gas inlet tube, a mechanical stirrer, a condenser and a dropping funnel was purged with nitrogen gas. Then, 20.5 g (0.1 mol) of β-phenethyl dichlorosilane and 100 mL of dichloromethane were placed in the flask, into which 80 g of pyridine was further added dropwise. Into the resultant reaction mixture was introduced 8.5 g (0.5 mol) of ammonia gas together with nitrogen gas.

After finishing the introduction of ammonia gas, the reaction mixture was allowed to further react for one hour and then filtered. Subsequently, the solvent was removed under a reduced pressure thereby to obtain 14.5 g (yield: 96%) of β-phenethyl(hydro)silazane. This polymer was found to have a repeating unit represented by the following chemical formula, and a molecular weight of 2,200.

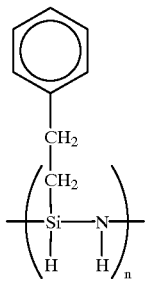

wherein n denotes a polymerization degree.

Subsequently, 2 g of this polymer was dissolved in 8 g of xylene to obtain a resin composition. This polymer solution was then spin-coated on a silicon substrate to form a film, the IR spectrum of which was then measured. As a result, the spectra of N—H, C—H, Si—H, phenyl and N—H were recognized at 3,400 cm$^{-1}$, at 3,000 cm$^{-1}$, at 2,100 cm$^{-1}$, at 1,610 cm$^{-1}$ and 1,510 cm$^{-1}$, and at 1,120 cm$^{-1}$, respectively.

Subsequently, this polymer solution was spin-coated on a substrate and then heated for five minutes at a temperature of 100° C. to form a resin layer, which was then baked according to the following heating process to obtain a silicon oxide film. Namely, the resin layer was heated for one hour to raise the temperature of the resin layer from room temperature to 250° C., and then maintained at this temperature for one hour. Thereafter, the temperature of the resin layer was increased from 250° C. to 500° C. over one hour and then maintained at 500° C. for one hour.

The silicon oxide film thus obtained was found to have a density of 1.0. When the average pore diameter of the oxide film was measured by means of a BET method based on the low temperature/low humidity physical adsorption of nitrogen gas, it was found to be 2.1 nm.

Example II-3

The interior of reaction system of 500 mL four-necked flask equipped with a gas inlet tube, a mechanical stirrer, a condenser and a dropping funnel was purged with nitrogen gas. Then, 15.7 g (0.1 mol) of t-butyl dichlorosilane and 100 mL of dichloromethane were placed in the flask, into which 80 g of pyridine was further added dropwise. Into the resultant reaction mixture was introduced 8.5 g (0.5 mol) of ammonia gas together with nitrogen gas.

After finishing the introduction of ammonia gas, the reaction mixture was allowed to further react for one hour and then filtered. Subsequently, the solvent was removed under a reduced pressure thereby to obtain 9.5 g (yield: 93%) of t-butyl(hydro)silazane. This polymer was found to have a repeating unit represented by the following chemical formula, and a molecular weight of 2,000.

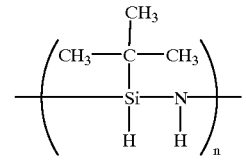

wherein n denotes a polymerization degree.

Subsequently, 2 g of this polymer was dissolved in 8 g of xylene to obtain a resin composition. This polymer solution was then spin-coated on a silicon substrate to form a film, the IR spectrum of which was then measured. As a result, the spectra of N—H, C—H, Si—H and N—H were recognized at 3,400 cm$^{-1}$, at 3,000 cm$^{-1}$, at 2,100 cm$^{-1}$ and at 1,120 cm$^{-1}$, respectively.

Subsequently, this polymer solution was spin-coated on a substrate and then heated for five minutes at a temperature of 100° C. to form a resin layer, which was then baked according to the following heating process to obtain a silicon oxide film. Namely, the resin layer was heated for one hour to raise the temperature of the resin layer from room temperature to 250° C., and then maintained at this temperature for one hour. Thereafter, the temperature of the resin layer was increased from 250° C. to 500° C. over one hour and then maintained at 500° C. for one hour.

The silicon oxide film thus obtained was found to have a density of 1.0. When the average pore diameter of the oxide film was measured by means of a BET method based on the low temperature/low humidity physical adsorption of nitrogen gas, it was found to be 2 nm.

Example II-4

The interior of reaction system of 500 mL four-necked flask equipped with a gas inlet tube, a mechanical stirrer, a condenser and a dropping funnel was purged with nitrogen gas. Then, 21.1 g (0.1 mol) of trifluoropropylmethyl dichlorosilane and 100 mL of dichloromethane were placed in the flask, into which 80 g of pyridine was further added dropwise. Into the resultant reaction mixture was introduced 8.5 g (0.5 mol) of ammonia gas together with nitrogen gas.

After finishing the introduction of ammonia gas, the reaction mixture was allowed to further react for one hour and then filtered. Subsequently, the solvent was removed under a reduced pressure thereby to obtain 14.5 g (yield: 96%) of trifluoropropyl(methyl)silazane. This polymer was found to have a repeating unit represented by the following chemical formula, and a molecular weight of 1,500.

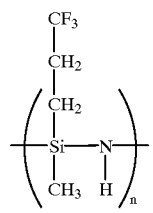

wherein n denotes a polymerization degree.

Subsequently, 2 g of this polymer was dissolved in 8 g of xylene to obtain a resin composition. This polymer solution was then spin-coated on a silicon substrate to form a film, the IR spectrum of which was then measured. As a result, the spectra of N—H, C—H, C—F and N—H were recognized at 3,400 cm$^{-1}$, at 3,000 cm$^{-1}$, at 1,210 cm$^{-1}$ and at 1,120 cm$^{-1}$, respectively.

Subsequently, this polymer solution was spin-coated on a substrate and then heated for five minutes at a temperature of 100° C. to form a resin layer, which was then baked according to the following heating process to obtain a silicon oxide film. Namely, the resin layer was heated for one hour to raise the temperature of the resin layer from room temperature to 250° C., and then maintained at this temperature for one hour. Thereafter, the temperature of the resin layer was increased from 250° C. to 500° C. over one hour and then maintained at 500° C. for one hour.

The silicon oxide film thus obtained was found to have a density of 1.1. When the average pore diameter of the oxide film was measured by means of a BET method based on the low temperature/low humidity physical adsorption of nitrogen gas, it was found to be 2 nm.

Example II-5

The interior of reaction system of 500 mL four-necked flask equipped with a gas inlet tube, a mechanical stirrer, a condenser and a dropping funnel was purged with nitrogen gas. Then, 9.9 g (0.05 mol) of trifluoropropyl dichlorosilane, 5.1 g (0.05 mol) of dichlorosilane and 100 mL of dichloromethane were placed in the flask, into which 80 g of pyridine was further added dropwise. Into the resultant reaction mixture was introduced 8.5 g (0.5 mol) of ammonia gas together with nitrogen gas.

After finishing the introduction of ammonia gas, the reaction mixture was allowed to further react for one hour and then filtered. Subsequently, the solvent was removed under a reduced pressure thereby to obtain 9.0 g (yield: 96%) of copolymer represented by the following chemical formula and having a molecular weight of 3,000.

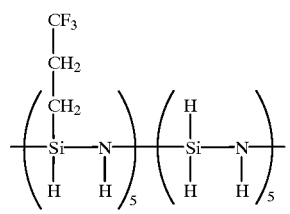

Subsequently, 2 g of this polymer was dissolved in 8 g of xylene to obtain a resin composition. This polymer solution was then spin-coated on a silicon substrate to form a film, the IR spectrum of which was then measured. As a result, the spectra of N—H, C—H, Si—H, C—F and N—H were recognized at 3,400 cm$^{-1}$, at 3,000 cm$^{-1}$, at 2,100 cm$^{-1}$, at 1,210 cm$^{-1}$ and at 1,120 cm$^{-1}$, respectively.

Subsequently, this polymer solution was spin-coated on a substrate and then heated for five minutes at a temperature of 100° C. to form a resin layer, which was then baked according to the following heating process to obtain a silicon oxide film. Namely, the resin layer was heated for one hour to raise the temperature of the resin layer from room temperature to 250° C., and then maintained at this temperature for one hour. Thereafter, the temperature of the resin layer was increased from 250° C. to 500° C. over one hour and then maintained at 500° C. for one hour.

The silicon oxide film thus obtained was found to have a density of 1.25. When the average pore diameter of the oxide film was measured by means of a BET method based on the low temperature/low humidity physical adsorption of nitrogen gas, it was found to be 2 nm.

Example II-6

The interior of reaction system of 500 mL four-necked flask equipped with a gas inlet tube, a mechanical stirrer, a condenser and a dropping funnel was purged with nitrogen gas. Then, 9.9 g (0.05 mol) of trifluoropropyl dichlorosilane, 5.7 g (0.05 mol) of methyldichlorosilane and 100 mL of dichloromethane were placed in the flask, into which 80 g of pyridine was further added dropwise. Into the resultant reaction mixture was introduced 8.5 g (0.5 mol) of ammonia gas together with nitrogen gas.

After finishing the introduction of ammonia gas, the reaction mixture was allowed to further react for one hour and then filtered. Subsequently, the solvent was removed under a reduced pressure thereby to obtain 9.5 g (yield: 94%) of copolymer represented by the following chemical formula and having a molecular weight of 2,000.

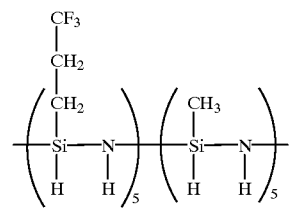

Subsequently, 2 g of this polymer was dissolved in 8 g of xylene to obtain a resin composition. This polymer solution was then spin-coated on a silicon substrate to form a film, the IR spectrum of which was then measured. As a result, the spectra of N—H, C—H, Si—H, C—F and N—H were recognized at 3,400 cm$^{-1}$, at 3,000 cm$^{-1}$, at 2,100 cm$^{-1}$, at 1,210 cm$^{-1}$ and at 1,120 cm$^{-1}$, respectively.

Subsequently, this polymer solution was spin-coated on a substrate and then heated for five minutes at a temperature of 100° C. to form a resin layer, which was then baked according to the following heating process to obtain a silicon oxide film. Namely, the resin layer was heated for one hour to raise the temperature of the resin layer from room temperature to 250° C., and then maintained at this temperature for one hour. Thereafter, the temperature of the resin layer was increased from 250° C. to 500° C. over one hour and then maintained at 500° C. for one hour.

The silicon oxide film thus obtained was found to have a density of 1.1. When the average pore diameter of the oxide film was measured by means of a BET method based on the low temperature/low humidity physical adsorption of nitrogen gas, it was found to be 2.1 nm.

Example II-7

The interior of reaction system of 500 mL four-necked flask equipped with a gas inlet tube, a mechanical stirrer, a condenser and a dropping funnel was purged with nitrogen gas. Then, 14.66 g (0.05 mol) of di(trifluoropropyl) dichlorosilane, 5.1 g (0.05 mol) of dichlorosilane and 100 mL of dichloromethane were placed in the flask, into which 80 g of pyridine was further added dropwise. Into the resultant reaction mixture was introduced 8.5 g (0.5 mol) of ammonia gas together with nitrogen gas.

After finishing the introduction of ammonia gas, the reaction mixture was allowed to further react for one hour and then filtered. Subsequently, the solvent was removed under a reduced pressure thereby to obtain 13.1 g (yield: 93%) of copolymer represented by the following chemical formula and having a molecular weight of 2,000.

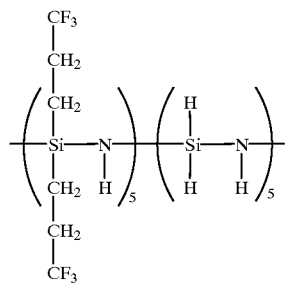

Subsequently, 2 g of this polymer was dissolved in 8 g of xylene to obtain a resin composition. This polymer solution was then spin-coated on a silicon substrate to form a film, the IR spectrum of which was then measured. As a result, the spectra of N—H, C—H, Si—H, C—F and N—H were recognized at 3,400 cm$^{-1}$, at 3,000 cm$^{-1}$, at 2,100 cm$^{-1}$, at 1,210 cm$^{-1}$ and at 1,120 cm$^{-1}$, respectively.

Subsequently, this polymer solution was spin-coated on a substrate and then heated for five minutes at a temperature of 100° C. to form a resin layer, which was then baked according to the following heating process to obtain a silicon oxide film. Namely, the resin layer was heated for one hour to raise the temperature of the resin layer from room temperature to 250° C., and then maintained at this temperature for one hour. Thereafter, the temperature of the resin layer was increased from 250° C. to 500° C. over one hour and then maintained at 500° C. for one hour.

The silicon oxide film thus obtained was found to have a density of 1.15. When the average pore diameter of the oxide film was measured by means of a BET method based on the low temperature/low humidity physical adsorption of nitrogen gas, it was found to be 2.1 nm.

Example II-8

The interior of reaction system of 500 mL four-necked flask equipped with a gas inlet tube, a mechanical stirrer, a condenser and a dropping funnel was purged with nitrogen gas. Then, 3.96 g (0.02 mol) of trifluoropropyl dichlorosilane, 3.42 g (0.03 mol) of methyldichlorosilane, 5.05 g (0.05 mol) of dichlorosilane and 100 mL of dichloromethane were placed in the flask, into which 80 g of pyridine was further added dropwise. Into the resultant reaction mixture was introduced 8.5 g (0.5 mol) of ammonia gas together with nitrogen gas.

After finishing the introduction of ammonia gas, the reaction mixture was allowed to further react for one hour and then filtered. Subsequently, the solvent was removed under a reduced pressure thereby to obtain 6.5 g (yield: 95%) of copolymer represented by the following chemical formula and having a molecular weight of 1,700.

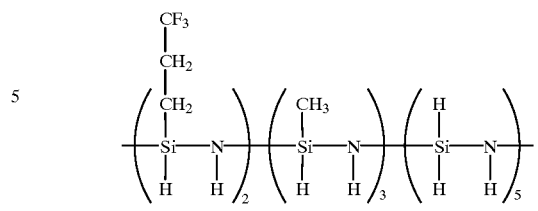

Subsequently, 2 g of this polymer was dissolved in 8 g of xylene to obtain a resin composition. This polymer solution was then spin-coated on a silicon substrate to form a film, the IR spectrum of which was then measured. As a result, the spectra of N—H, C—H, Si—H, C—F and N—H were recognized at 3,400 cm$^{-1}$, at 3,000 cm$^{-1}$, at 2,100 cm$^{-1}$, at 1,210 cm$^{-1}$ and at 1,120 cm$^{-1}$, respectively.

Subsequently, this polymer solution was spin-coated on a substrate and then heated for five minutes at a temperature of 100° C. to form a resin layer, which was then baked according to the following heating process to obtain a silicon oxide film. Namely, the resin layer was heated for one hour to raise the temperature of the resin layer from room temperature to 250° C., and then maintained at this temperature for one hour. Thereafter, the temperature of the resin layer was increased from 250° C. to 500° C. over one hour and then maintained at 500° C. for one hour.

The silicon oxide film thus obtained was found to have a density of 1.15. When the average pore diameter of the oxide film was measured by means of a BET method based on the low temperature/low humidity physical adsorption of nitrogen gas, it was found to be 2 nm.

Example II-9

The interior of reaction system of 500 mL four-necked flask equipped with a gas inlet tube, a mechanical stirrer, a condenser and a dropping funnel was purged with nitrogen gas. Then, 3.96 g (0.02 mol) of trifluoropropyl dichlorosilane, 9.12 g (0.08 mol) of methyldichlorosilane and 100 mL of dichloromethane were placed in the flask, into which 80 g of pyridine was further added dropwise. Into the resultant reaction mixture was introduced 8.5 g (0.5 mol) of ammonia gas together with nitrogen gas.

After finishing the introduction of ammonia gas, the reaction mixture was allowed to further react for one hour and then filtered. Subsequently, the solvent was removed under a reduced pressure thereby to obtain 7.1 g (yield: 94%) of copolymer represented by the following chemical formula and having a molecular weight of 2,000.

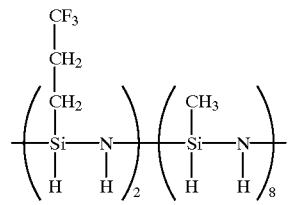

Subsequently, 2 g of this polymer was dissolved in 8 g of xylene to obtain a resin composition. This polymer solution was then spin-coated on a silicon substrate to form a film, the IR spectrum of which was then measured. As a result, the spectra of N—H, C—H, Si—H, C—F and N—H were recognized at 3,400 cm$^{-1}$, at 3,000 cm$^{-1}$, at 2,100 cm$^{-1}$, at 1,210 cm$^{-1}$ and at 1,120 cm$^{-1}$, respectively.

Subsequently, this polymer solution was spin-coated on a substrate and then heated for five minutes at a temperature of 100° C. to form a resin layer, which was then baked according to the following heating process to obtain a silicon oxide film. Namely, the resin layer was heated for one hour to raise the temperature of the resin layer from room temperature to 250° C., and then maintained at this temperature for one hour. Thereafter, the temperature of the resin layer was increased from 250° C. to 500° C. over one hour and then maintained at 500° C. for one hour.

The silicon oxide film thus obtained was found to have a density of 1.1. When the average pore diameter of the oxide film was measured by means of a BET method based on the low temperature/low humidity physical adsorption of nitrogen gas, it was found to be 2 nm.

Example II-10

The interior of reaction system of 500 mL four-necked flask equipped with a gas inlet tube, a mechanical stirrer, a condenser and a dropping funnel was purged with nitrogen gas. Then, 3.96 g (0.02 mol) of trifluoropropyl dichlorosilane, 9.12 g (0.08 mol) of methyldichlorosilane and 100 mL of dichloromethane were placed in the flask, into which 80 g of pyridine was further added dropwise. Into the resultant reaction mixture was introduced 15.53 g (0.5 mol) of methyl amine together with nitrogen gas.

After finishing the introduction of methyl amine, the reaction mixture was allowed to further react for one hour and then filtered. Subsequently, the solvent was removed under a reduced pressure thereby to obtain 13.0 g (yield: 94%) of copolymer represented by the following chemical formula and having a molecular weight of 1,700.

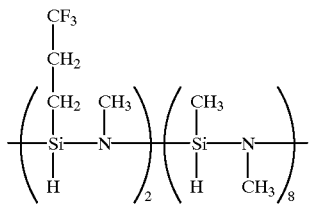

Subsequently, 2 g of this polymer was dissolved in 8 g of xylene to obtain a resin composition. This polymer solution was then spin-coated on a silicon substrate to form a film, the IR spectrum of which was then measured. As a result, the spectra of C—H, Si—H and C—F were recognized at 3,000 cm$^{-1}$, at 2,100 cm$^{-1}$ and at 1,210 cm$^{-1}$, respectively.

Subsequently, this polymer solution was spin-coated on a substrate and then heated for five minutes at a temperature of 100° C. to form a resin layer, which was then baked according to the following heating process to obtain a silicon oxide film. Namely, the resin layer was heated for one hour to raise the temperature of the resin layer from room temperature to 250° C., and then maintained at this temperature for one hour. Thereafter, the temperature of the resin layer was increased from 250° C. to 500° C. over one hour and then maintained at 500° C. for one hour.

The silicon oxide film thus obtained was found to have a density of 1.1. When the average pore diameter of the oxide film was measured by means of a BET method based on the low temperature/low humidity physical adsorption of nitrogen gas, it was found to be 2 nm.

Example II-11

The interior of reaction system of 500 mL four-necked flask equipped with a gas inlet tube, a mechanical stirrer, a condenser and a dropping funnel was purged with nitrogen gas. Then, 4.22 g (0.02 mol) of trifluoropropylmethyl dichlorosilane, 8.16 g (0.08 mol) of dichlorosilane and 100 mL of dichloromethane were placed in the flask, into which 80 g of pyridine was further added dropwise. Into the resultant reaction mixture was introduced 8.5 g (0.5 mol) of ammonia gas together with nitrogen gas.

After finishing the introduction of ammonia gas, the reaction mixture was allowed to further react for one hour and then filtered. Subsequently, the solvent was removed under a reduced pressure thereby to obtain 6.2 g (yield: 93%) of copolymer represented by the following chemical formula and having a molecular weight of 1,700.

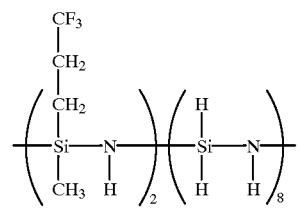

Subsequently, 2 g of this polymer was dissolved in 8 g of xylene to obtain a resin composition. This polymer solution was then spin-coated on a silicon substrate to form a film, the IR spectrum of which was then measured. As a result, the spectra of N—H, C—H, Si—H, C—F and N—H were recognized at 3,400 cm$^{-1}$, at 3,000 cm$^{-1}$, at 2,100 cm$^{-1}$, at 1,210 cm$^{-1}$ and at 1,120 cm$^{-1}$, respectively.

Subsequently, this polymer solution was spin-coated on a substrate and then heated for five minutes at a temperature of 100° C. to form a resin layer, which was then baked according to the following heating process to obtain a silicon oxide film. Namely, the resin layer was heated for one hour to raise the temperature of the resin layer from room temperature to 250° C., and then maintained at this temperature for one hour. Thereafter, the temperature of the resin layer was increased from 250° C. to 500° C. over one hour and then maintained at 500° C. for one hour.

The silicon oxide film thus obtained was found to have a density of 1.1. When the average pore diameter of the oxide film was measured by means of a BET method based on the low temperature/low humidity physical adsorption of nitrogen gas, it was found to be 2 nm.

Example II-12

2 g of the resin obtained in Example II-1 was dissolved in 18 g of xylene, and then mixed with a solution in xylene of poly(perhydrosilazane) (Tonen Corporation) to obtain a polymer solution.

Subsequently, this polymer solution was spin-coated on a substrate and then heated for five minutes at a temperature of 100° C. to form a resin layer, which was then baked according to the following heating process to obtain a silicon oxide film. Namely, the resin layer was heated for one hour to raise the temperature of the resin layer from room temperature to 250° C., and then maintained at this temperature for one hour. Thereafter, the temperature of the resin layer was increased from 250° C. to 500° C. over one hour and then maintained at 500° C. for one hour.

The silicon oxide film thus obtained was found to have a density of 1.3. When the average pore diameter of the oxide film was measured by means of a BET method based on the low temperature/low humidity physical adsorption of nitrogen gas, it was found to be 2 nm.

Example II-13

2 g of the resin obtained in Example II-1 was dissolved in 18 g of xylene, and then mixed with OCD-type 7 (Tokyo Ohka Kogyo Co., Ltd.) to obtain a polymer solution.

Subsequently, this polymer solution was spin-coated on a substrate and then heated for five minutes at a temperature of 100° C. to form a resin layer, which was then baked according to the following heating process to obtain a silicon oxide film. Namely, the resin layer was heated for one hour to raise the temperature of the resin layer from room temperature to 250° C., and then maintained at this temperature for one hour. Thereafter, the temperature of the resin layer was increased from 250° C. to 500° C. over one hour and then maintained at 500° C. for one hour.

The silicon oxide film thus obtained was found to have a density of 1.2. When the average pore diameter of the oxide film was measured by means of a BET method based on the low temperature/low humidity physical adsorption of nitrogen gas, it was found to be 2.1 nm.

Then, materials of forming silicon oxide film thus obtained were employed to form silicon oxide films respectively, and the dielectric constant of each oxide film was measured as explained below.

Example II-14

The material of forming silicon oxide film obtained in Example II-1 was spin-coated on a silicon substrate and then pre-cured for 3 minutes at a temperature of 100° C. Thereafter, the oxide layer was baked at a temperature of 150° C. for one hour, at a temperature of 250° C. for one hour, at a temperature of 350° C. for one hour, and then at a temperature of 450° C. for three hours to obtain a silicon oxide film. When the dielectric constant of this silicon oxide film was measured, it was found to be 2.0.

Example II-15

A silicon oxide film was formed in the same manner as explained in Example II-14 except that the material of forming silicon oxide film obtained in Example II-2 was employed. When the dielectric constant of the resultant silicon oxide film was measured, it was found to be 1.9.

Example II-16

A silicon oxide film was formed in the same manner as explained in Example II-14 except that the material of forming silicon oxide film obtained in Example II-5 was employed. When the dielectric constant of the resultant silicon oxide film was measured, it was found to be 2.2.

Example II-17

A silicon oxide film was formed in the same manner as explained in Example II-14 except that the material of forming silicon oxide film obtained in Example II-6 was employed. When the dielectric constant of the resultant silicon oxide film was measured, it was found to be 2.1.

Example II-18

A silicon oxide film was formed in the same manner as explained in Example II-14 except that the material of forming silicon oxide film obtained in Example II-8 was employed. When the dielectric constant of the resultant silicon oxide film was measured, it was found to be 2.3.

Example II-19

A silicon oxide film was formed in the same manner as explained in Example II-14 except that the material of forming silicon oxide film obtained in Example II-9 was employed. When the dielectric constant of the resultant silicon oxide film was measured, it was found to be 2.1.

Example II-20

A silicon oxide film was formed in the same manner as explained in Example II-14 except that the material of forming silicon oxide film obtained in Example II-12 was employed. When the dielectric constant of the resultant silicon oxide film was measured, it was found to be 2.3.

Example II-21

An LSI was manufactured in the same manner as explained in Example I-21 except that the interlayer insulating film 4 was formed according to the method described in Example II-20. As a result, it was possible to obtain an LSI exhibiting high reliability and high operation speed.

Example II-22

An LSI was manufactured in the same manner as explained in Example I-21 except that the interlayer insulating film 4 was formed according to the method described in Example II-16. As a result, it was possible to obtain an LSI exhibiting high reliability and high operation speed.

Example II-23

An LSI was manufactured in the same manner as explained in Example I-21 except that the interlayer insulating film 4 was formed according to the method described in Example II-19. As a result, it was possible to obtain an LSI exhibiting high reliability and high operation speed.

Example II-24

A semiconductor element having the same structure as explained in Example I-24 was prepared except that the passivation film 10 was formed with a silicon oxide film which was prepared according to the method described in Example II-15. Since the dielectric constant of the silicon oxide film was as low as 2.0, the semiconductor element thus obtained exhibited a high reliability and a high operation speed. It was also confirmed that there was little possibility of producing a defective product during the manufacture of the semiconductor element.

Example II-25

A multi-chip module having the same structure as explained in Example I-25 was prepared except that the interlayer insulation film 23 was formed with a silicon oxide film which was prepared according to the method described in Example II-14. Since the dielectric constant of the silicon oxide film was gas low as 2.1, the device thus obtained exhibited a high operation speed. Furthermore, since the step portions of the copper wiring 22 could be greatly absorbed by the oxide film, it was possible to form an insulating film having a flat surface, thus improving the reliability of the device.

Example II-26

A multi-chip module was manufactured in the same manner as explained in Example II-25 except that the interlayer insulating film 23 was formed according to the method described in Example II-17. As a result, it was possible to obtain a multi-chip module exhibiting high reliability and high operation speed.

Example II-27

0.12 g of titanium butoxide tetramer was mix with 10 g of the polymer solution obtained in Example II-8 to prepare a resin solution. A silicon oxide film was formed in the same manner as explained in Example II-14 except that this resin solution was employed. When the dielectric constant of the resultant silicon oxide film was measured, it was found to be 2.2.

Example II-28

0.06 g of titanium butoxide tetramer was mixed with 10 g of the polymer solution obtained in Example II-9 to prepare a resin solution. A silicon oxide film was formed in the same manner as explained in Example II-14 except that this resin solution was employed. When the dielectric constant of the resultant silicon oxide film was measured, it was found to be 2.1.

Comparative Example 1

A silicon oxide film was formed in the same manner as explained in Example I-14 except that OCD type 11 (Tokyo Ohka Kogyo Co., Ltd.) which was a coating type material of forming silicon oxide film was employed. When the dielectric constant of the resultant silicon oxide film was measured, it was found to be 3.0.

Comparative Example 2

First of all, methyl cis-sesquioxane was dissolved in methylisobutyl ketone to obtain a 15 wt. % polymer solution. The methyl cis-sesquioxane employed in this case was a compound having the following chemical formula.

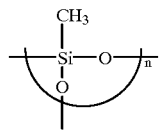

wherein n denotes a polymerization degree.

A silicon oxide film was formed in the same manner as explained in Example I-14 except that this polymer solution was employed. When the dielectric constant of the resultant silicon oxide film was measured, it was found to be 3.1.

EXAMPLE III 10 g of alkoxy silane comprising methyltriethoxy silane containing 10 wt. % of trifluoropropyltrimethoxy silane, 10 g of isopropyl alcohol, 3.4 g of butanol, 3.4 g of water and 0.1 g of oxalic acid dihydrate were mixed together and then allowed to react for two hours at a temperature of 70° C. to obtain a copolymer represented by the following chemical formula.

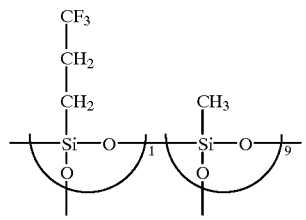

A copolymer was prepared in the same manner as explained above except that the content of trifluoropropyltrimethoxy silane was changed to 20 wt. %. Further, a copolymer was prepared in the same manner as explained above except that the content of trifluoropropyltrimethoxy silane was changed to 30 wt. %.

Further, 10 g of methyltriethoxy silane, 10 g of isopropyl alcohol, 3.4 g of butanol, 3.4 g of water and 0.1 g of oxalic acid dihydrate were mixed together and then allowed to react for two hours at a temperature of 70° C. to obtain a copolymer represented by the following chemical formula. Namely, the content of trifluoropropyltrimethoxy silane in this copolymer was 0 wt. %.

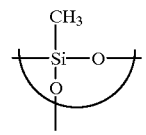

Each polymer solution was then spin-coated on a 6 inches silicon wafer to form a film and pre-cured at a temperature of 100° C. for 5 minutes.

Subsequently, each film was baked according to the following heating process to obtain a thin oxide film. Namely, the resin layer was heated for one hour to raise the temperature of the resin layer from room temperature to 250° C., and then maintained at this temperature for one hour. Thereafter, the temperature of the resin layer was increased from 250° C. to 500° C. over one hour and then maintained at 500° C. for one hour. Subsequently, the film was allowed to cool down to room temperature over three hours obtain the thin oxide film.

Figure 4:
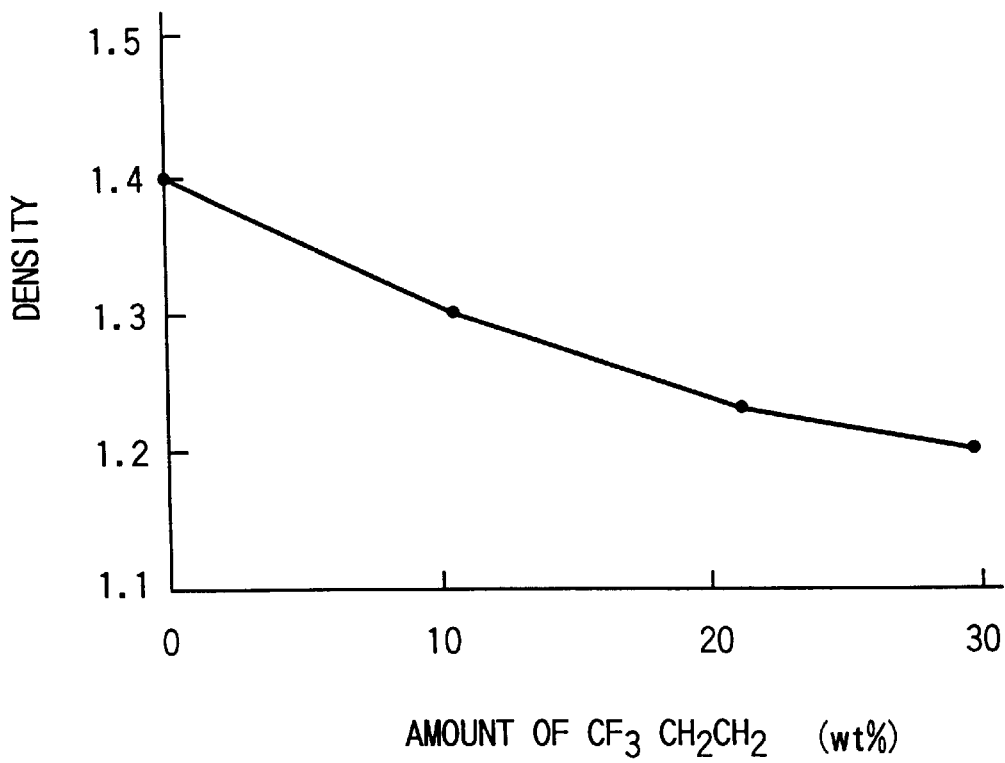
FIG. 4 is a graph illustrating a relationship between the content of trifluoropropyltrimethoxy silane and the density of an oxide film.

Then, the density of each thin oxide film was measured, and the relationship thereof to the content of trifluoropropyltrimethoxy silane was plotted, the result thereof being shown in FIG. 4. As shown in FIG. 4, the density of thin oxide film was lowered in proportion to an increase in content of trifluoropropyltrimethoxy silane. For example, when the content of trifluoropropyltrimethoxy silane was 0 wt. %, the density of the oxide film was about 1.4, whereas when the content of trifluoropropyltrimethoxy silane was increased to 30 wt. %, the density of the oxide film was decreased down to about 1.2.

Figure 5:
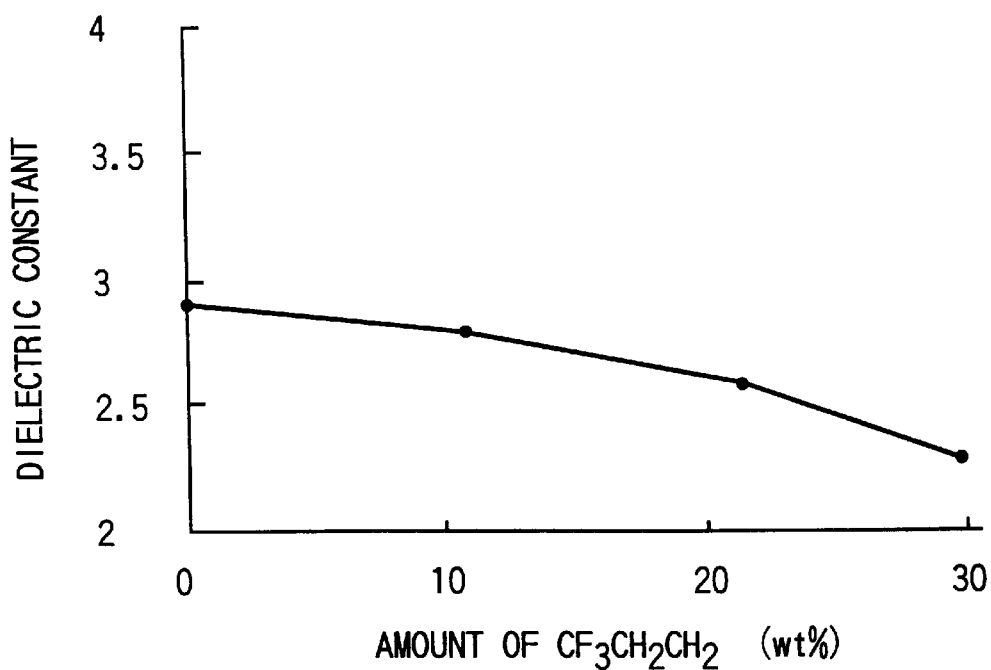
FIG. 5 is a graph illustrating a relationship between the content of trifluoropropyltrimethoxy silane and the dielectric constant of an oxide film.

Then, the dielectric constant of each thin oxide film was measured, and the relationship thereof to the content of trifluoropropyltrimethoxy silane was plotted, the result thereof being shown in FIG. 5. As shown in FIG. 5, the dielectric constant of thin oxide film was lowered in proportion to an increase in content of trifluoropropyltrimethoxy silane. For example, when the content of trifluoropropyltrimethoxy silane was 0 wt. %, the dielectric constant of the oxide film was about 2.8, whereas when the content of trifluoropropyltrimethoxy silane was increased to 30 wt. %, the dielectric constant of the oxide film was decreased down to about 2.3.

Then, the surface area and the distribution of fine pores of the oxide film where the content of trifluoropropyltrimethoxy silane was 0 wt. %, as well as of the oxide film where the content of trifluoropropyltrimethoxy silane was 30 wt. % were measured, the results being summarized in the following Table 1.

The surface area was measured by making use of an automatic specific surface area-measuring apparatus (Shimadzu Corporation), and the distribution of fine pores size was measured by means of a BET method based on the adsorption of nitrogen gas.

TABLE 1

| Content of CF₃CH₂CH₂ (wt. %) | Surface area (m²/g) | Average pore diameter (nm) |
|---|---|---|
| 0 | 525.1 | 2.13 |
| 30 | 648.6 | 2.06 |

As shown in Table 1, the surface area of a silicon oxide film was increased by the addition of trifluoropropyltrimethoxy silane to 100 m²/g or more, but the pore size was not increased by the addition of trifluoropropyltrimethoxy silane. Accordingly, it was determined that the increase in surface area of the oxide film was brought about by an increase of nothing but the number of fine pores.

Since the density of the oxide film is lowered through an increase in number of very fine pores in the oxide film as explained above, it is possible according to this invention to lower the dielectric constant of the silicon oxide film.

As explained above, it is possible according to this invention to provide a material of forming silicon oxide film which enables to form a silicon oxide film having a large free volume. The silicon oxide film which is to be formed by making use of this material of forming silicon oxide film is excellent in heat resistance and low in dielectric constant, so that if this silicon oxide film is to be employed as an insulating film for a semiconductor device, the reliability of the device can be enhanced and at the same time, the operation speed of the device would be accelerated. Therefore, this invention is very valuable in industrial viewpoint.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

We claim:

1. A method for forming a silicon oxide film, which comprises the steps of;

forming a resin layer by coating a material of forming silicon oxide film comprising a polymer containing a repeating unit represented by the following general formula (1A), (1B) or (1C) on a substrate, and by heat-treating said material of forming silicon oxide film coated on said substrate; and heating said resin layer at a temperature ranging from 250° C. to the glass transition point of said material of forming silicon oxide film;

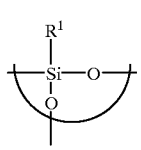
(1A)

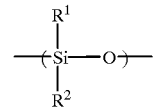
(1B)

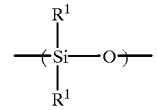
(1C)

wherein R¹ is a substituent group which can be eliminated at a temperature ranging from 250° C. to the glass transition point of said material of forming silicon oxide film; and R² is a substituent group which cannot be eliminated at a temperature of 250° C. or more.

2. The method of forming a silicon oxide film according to claim 1, wherein said R² is a substituent group which cannot be eliminated at a temperature of the glass transition point of said material or less.

3. A method for forming a silicon oxide film, which comprises the steps of;

forming a resin layer by coating a material of forming silicon oxide film comprising a polymer containing a repeating unit represented by the following general formula (2A), (2B) or (2C) on a substrate, and by heat-treating said material of forming silicon oxide film coated on said substrate; and heating said resin layer at a temperature ranging from 250° C. to the glass transition point of said material of forming silicon oxide film;

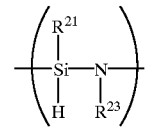
(2A)

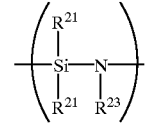
(2B)

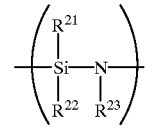
(2C)

wherein R²¹ is a substituent group which can be eliminated at a temperature ranging from 250° C. to the glass transition point of said material of forming silicon oxide film; R²² is a substituent group which cannot be eliminated at a temperature of 250° C. or more; and R²³ is hydrogen atom, a substituted or unsubstituted alkyl group, or a substituted or unsubstituted aromatic group.

4. The method of forming a silicon oxide film according to claim 3, wherein said R²² is a substituent group which cannot be eliminated at a temperature of the glass transition point of said material or less.

* * * * *